United States Patent
Abe et al.

(10) Patent No.: US 8,153,996 B2
(45) Date of Patent: Apr. 10, 2012

(54) PATTERN FORMING APPARATUS AND PATTERN FORMING METHOD

(75) Inventors: Takayuki Abe, Kanagawa (JP); Rikio Tomiyoshi, Shizuoka (JP); Hiroshi Nozue, Kanagawa (JP)

(73) Assignee: NuFlare Technology, Inc., Numazu-shi (JP)

( * ) Notice: Subject to any disclaimer, the term of this patent is extended or adjusted under 35 U.S.C. 154(b) by 217 days.

(21) Appl. No.: 12/547,958

(22) Filed: Aug. 26, 2009

(65) Prior Publication Data

US 2010/0072403 A1 Mar. 25, 2010

(30) Foreign Application Priority Data

Sep. 19, 2008 (JP) ................................. 2008-241562
Jul. 16, 2009 (JP) ................................. 2009-167393

(51) Int. Cl.
- G21K 5/10 (2006.01)
- H01L 21/027 (2006.01)
- H01J 37/305 (2006.01)

(52) U.S. Cl. .............................. 250/492.22; 250/492.23

(58) Field of Classification Search ..... 250/492.1–492.3
See application file for complete search history.

(56) References Cited

U.S. PATENT DOCUMENTS

| | | | |
|---|---|---|---|
| 6,346,354 B1 * | 2/2002 | Abe et al. ........................ | 430/30 |
| 6,960,774 B2 * | 11/2005 | Coss et al. ............... | 250/492.21 |
| 7,105,842 B2 * | 9/2006 | Tanimoto et al. ......... | 250/492.22 |
| 7,439,502 B2 * | 10/2008 | Nakasuji et al. ............. | 250/306 |
| 7,601,968 B2 * | 10/2009 | Abe et al. .................. | 250/396 R |
| 7,786,454 B2 * | 8/2010 | Parker ....................... | 250/492.23 |
| 7,800,084 B2 * | 9/2010 | Tamamushi ............. | 250/492.22 |
| 7,863,586 B2 * | 1/2011 | Abe .......................... | 250/492.22 |

(Continued)

FOREIGN PATENT DOCUMENTS

JP 6-84771 3/1994

(Continued)

OTHER PUBLICATIONS

H. Yasuda et al., "Evaluation of the Multi-column-cell (MCC)-PoC(proof of concept) system", $3^{rd}$ Symposium of Charged Particle Optics, pp. 125-128.

(Continued)

*Primary Examiner* — Jack Berman
*Assistant Examiner* — Wyatt Stoffa
(74) *Attorney, Agent, or Firm* — Oblon, Spivak, McClelland, Maier & Neustadt, L.L.P.

(57) ABSTRACT

A pattern forming apparatus using lithography technique includes a stage configured to allow a target object to be placed thereon; a plurality of columns configured to form patterns on the target object by using a charged particle beam while moving relatively to the stage; a pattern forming rule setting unit configured to set a pattern forming rule depending on a position of broken one of the plurality of columns; a region setting unit configured to set regions so that unbroken ones of the plurality of columns respectively form a pattern in one of the regions; a plurality of control circuits each configured to control any one of the plurality of columns different from others of the plurality of columns controlled by others of the plurality of control circuits; and a pattern forming data processing unit configured to perform a converting process on pattern forming data for the regions set to output a corresponding data generated by the converting process to the control circuit of a corresponding one of the unbroken ones of the plurality of columns respectively.

3 Claims, 18 Drawing Sheets

U.S. PATENT DOCUMENTS

| | | | |
|---|---|---|---|
| 2006/0076513 A1* | 4/2006 | Nakamura et al. | 250/492.22 |
| 2007/0114463 A1* | 5/2007 | Nakasugi et al. | 250/492.23 |
| 2008/0050848 A1* | 2/2008 | Abe | 438/14 |
| 2008/0054196 A1* | 3/2008 | Hiroshima | 250/492.23 |
| 2009/0200495 A1* | 8/2009 | Platzgummer | 250/492.22 |
| 2009/0212213 A1* | 8/2009 | Nakasuji et al. | 250/310 |
| 2010/0181479 A1* | 7/2010 | Knippelmeyer et al. | 250/310 |

FOREIGN PATENT DOCUMENTS

| | | |
|---|---|---|
| JP | 2000-43317 | 2/2000 |
| JP | 2006-80303 | 3/2006 |
| JP | 2006-278492 | 10/2006 |

OTHER PUBLICATIONS

T. Haraguchi et al., "Development of electromagnetic lenses for multielectron beam lithography system", J. Vac. Sci. Technol. B20(6), Nov./Dec. 2002, p. 2726.

T. Haraguchi et al., "Multicolumn cell: Evalution of the proof of concept system", J. Vac. Sci. Technol. B22(3), May/Jun. 2004, p. 985.

* cited by examiner

PATTERN FORMING APPARATUS AND PATTERN FORMING METHOD

CROSS-REFERENCE TO RELATED APPLICATION

This application is based upon and claims the benefit of priority from prior Japanese Patent Application No. 2008-241562 filed on Sep. 19, 2008 in Japan, and prior Japanese Patent Application No. 2009-167393 filed on Jul. 16, 2009 in Japan, the entire contents of which are incorporated herein by reference.

BACKGROUND OF THE INVENTION

1. Field of the Invention

The present invention relates to a pattern forming apparatus and a pattern forming method. For example, the present invention relates to an apparatus and a method which allows a pattern forming process even when a breakdown in a column occurs in an electron beam pattern forming apparatus of multi-column system.

2. Related Art

A lithography technique which leads development of micropatterning of a semiconductor device is a very important process for exclusively generating a pattern in semiconductor manufacturing processes. In recent years, with an increase in integration density of an LSI, a circuit line width required for semiconductor devices is getting smaller year by year. In order to form a desired circuit pattern on such semiconductor device, a high-precision original pattern (also called a reticle or a mask) is necessary. In this case, an electron beam pattern forming technique essentially has an excellent resolution, and is used in production of high-precision original patterns.

FIG. 24 is a conceptual diagram for explaining an operation of a variable-shaped electron beam lithography apparatus.

The variable-shaped electron beam (EB: Electron Beam) lithography apparatus operates as described below. In a first aperture plate 410, a quadrangular, for example, a rectangular opening 411 to shape an electron beam 330 is formed. In a second aperture plate 420, a variable-shaped opening 421 to shape the electron beam 330 having passed through the opening 411 of the aperture plate 410 into a desired quadrangular shape is formed. The electron beam 330 irradiated from the charged particle source 430 and having passed through the opening 411 of the aperture plate 410 is deflected by a deflector. The electron beam 330 passes through a part of the variable-shaped opening 421 of the aperture 420 plate and is irradiated onto a target object placed on a stage. The stage continuously moves in one predetermined direction (for example, X direction) during the pattern forming. In this manner, a quadrangular shape which can pass through both the opening 411 of the aperture plate 410 and the variable-shaped opening 421 of the aperture plate 420 is formed in a pattern forming region on the target object 340. The scheme for causing a beam to pass through both the opening 411 of the aperture plate 410 and the variable-shaped opening 421 of the aperture plate 420 to form an arbitrary shape is called a variable-shaping scheme.

Conventionally, an electron beam pattern forming apparatus in which one beam (single beam) is irradiated from a single column obtained by mounting one optical system column on one electron lens barrel is employed. In the electron beam pattern forming apparatus using a single beam, an LSI pattern is virtually divided into regions called stripes, frames, or fields. Pattern forming is sequentially performed in the regions, so that pattern forming of an entire LSI pattern is performed. In a system which continuously moves a stage on which a mask is placed, the regions are called stripes or frames. In a system in which pattern forming is performed by a step-and-repeat method, the regions are called fields. The sizes of the regions are determined on the basis of maximum deflection region of corresponding deflectors, respectively. The region is divided according to the size.

As against the pattern forming apparatus of the single-column system, a pattern forming apparatus of multi-column-cell (MCC) system obtained by mounting two or more optical columns on one electron lens barrel has been developed. Each of the columns is configured to have the same pattern forming condition. In each of the columns, variable-shaped pattern forming is performed (for example, see "Yasuda Hiroshi, Haraguchi Takeshi, et al., "Multicolumn Cell MCC-PoC (Proof of concept) system evaluation", 3rd symposium of charged particle optics, pp. 125 to 128, Sep. 18 to 19, 2003", "T. Haraguchi, T. Sakazaki, S. Hamaguchi and H. Yasuda, "Development of electromagnetic lenses for multielectron beam lithography system", 2726, J. Vac. Sci. Technol. B20 (6), November/December 2002", or "T. Haraguchi, T. Sakazaki, T. Satoh, M. Nakano, S. Hamaguchi, T. Kiuchi, H. Yabara and H. Yasuda, "Multicolumn cell: Evaluation of the proof of concept system", 985, J. Vac. Sci, Technol. B22 (3), May/June 2004"). With an increase in integration density of an LSI, a pattern forming time taken when pattern forming is performed becomes long. In contrast to this, when pattern forming is simultaneously performed by using a multi-column system, a pattern forming time can be made shorter than that taken when pattern forming is performed by the single-column system.

However, when a breakdown occurs in one column itself or a plurality of columns themselves, or when a breakdown occurs in control of a beam in one column or in control of beams in a plurality of columns (these failures will be collectively called a breakdown of a column hereinafter.), the pattern forming apparatus cannot be operated. This is because, when a pattern forming process is performed in this state, a pattern to be formed by a broken column is not formed, resulting in a missing pattern. For this reason, the pattern forming process cannot be advanced until the apparatus is recovered from the breakdown.

As described above, when a breakdown of a column occurs, the pattern forming apparatus cannot be operated. For this reason, the pattern forming process cannot be advanced until the apparatus is recovered from the breakdown. Therefore, there have been cases that a pattern forming time is difficult to be further shortened even by a pattern forming apparatus of multi-column system.

BRIEF SUMMARY OF THE INVENTION

An object of embodiments of the present invention is to provide a pattern forming apparatus and a pattern forming method which allows a pattern forming operation even when a breakdown in column occurs in an apparatus of multi-column system.

In accordance with one aspect of the present invention, a pattern forming apparatus using lithography technique includes a stage configured to allow a target object to be placed thereon; a plurality of columns configured to form patterns on the target object by using a charged particle beam while moving relatively to the stage; a pattern forming rule setting unit configured to set a pattern forming rule depending on a position of broken one of the plurality of columns; a region setting unit configured to set regions so that unbroken ones of the plurality of columns respectively form a pattern in one of the regions; a plurality of control circuits each configured to control any one of the plurality of columns different from others of the plurality of columns controlled by others of the plurality of control circuits; and a pattern forming data processing unit configured to perform a converting process on pattern forming data for the regions set to output a corresponding data generated by the converting process to the control circuit of a corresponding one of the unbroken ones of the plurality of columns respectively.

In accordance with another aspect of the present invention, a pattern forming method using lithography technique includes setting a pattern forming rule depending on a position of a broken column in a pattern forming apparatus including a plurality of columns; setting regions so that unbroken ones of the plurality of columns respectively form a pattern in one of the regions; performing a converting process on pattern forming data for the regions set to output a corresponding data generated by the converting process to a control circuit of a corresponding one of the unbroken ones of the plurality of columns; and forming patterns on a target object by using charged particle beams obtained and by using the unbroken ones of the plurality of columns while the plurality of columns is moved relatively to a stage on which the target object is placed.

DETAILED DESCRIPTION OF THE INVENTION

In the following embodiments, a configuration which uses an electron beam as an example of a charged particle beam will be described. The charged particle beam is not limited to an electron beam, and another charged particle beam such as an ion beam may be used.

Embodiment 1

Figure 1:
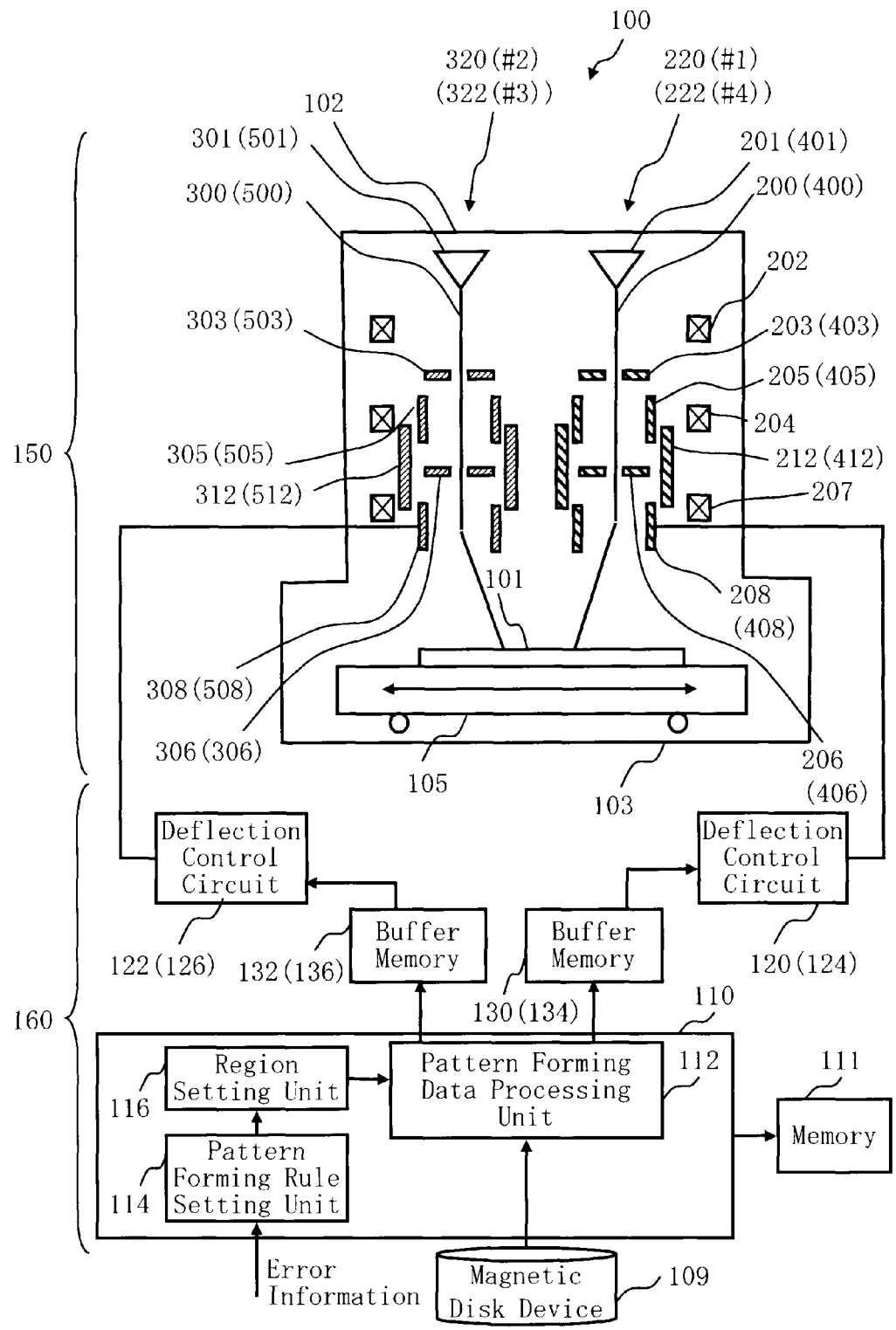
FIG. 1 is a conceptual diagram showing a configuration of a pattern forming apparatus according to Embodiment 1.

FIG. 1 is a conceptual diagram showing a configuration of a pattern forming apparatus according to Embodiment 1. In FIG. 1, a pattern forming apparatus, "pattern writing apparatus", or "lithography apparatus" 100 includes a pattern forming unit, or "writing unit" 150 and a control unit 160. The pattern forming apparatus 100 is as an example of a charged particle beam pattern forming apparatus. The pattern forming apparatus 100 forms a desired pattern on a target object 101 using lithography technique. The pattern forming unit 150 includes an electron lens barrel 102 and a pattern forming chamber, or "writing chamber" 103. The control unit 160 includes a magnetic disk device 109, a control computer 110, a memory 111, deflection control circuits 120, 122, 124, and 126, and buffer memories 130, 132, 134, and 136. In the control computer 110, a pattern forming data processing unit 112, a pattern forming rule setting unit 114, and a region setting unit 116 are arranged. The pattern forming data processing unit 112, the pattern forming rule setting unit 114, and the region setting unit 116 may be configured as processing functions executed by software. The pattern forming data processing unit 112, the pattern forming rule setting unit 114, and the region setting unit 116 may also be configured by hardware obtained by electric circuits. The units may also be configured by combinations of the hardware obtained by electric circuits and software. The units may also be configured by combinations of such hardware and firmware. When the units are realized by the software or the combinations with the software, information to be input to the control computer 110 which executes a process or information which is obtained during an arithmetic process and after the arithmetic process is stored in the memory 111 at respective timings.

In the electron lens barrel 102, electron gun assemblies 201, 301, 401, and 501, an illumination lens 202, first aperture plates 203, 303, 403, and 503, a projection lens 204, deflectors 205, 305, 405, and 505, second aperture plates 206, 306, 406, and 506, an objective lens 207, deflectors 208, 308, 408, and 508, and blocking cylinders 212, 312, 412, and 512 are arranged.

In this case, a first column 220 (#1) includes the electron gun assembly 201, the first aperture plate 203, the deflector 205, the second aperture plate 206, the blocking cylinder 212, and the deflector 208. A second column 320 (#2) includes the electron gun assembly 301, the first aperture plate 303, the deflector 305, the second aperture plate 306, the blocking cylinder 312, and the deflector 308. A third column 322 (#3) includes the electron gun assembly 501, the first aperture plate 503, the deflector 505, the second aperture plate 506, the blocking cylinder 512, and the deflector 508. A fourth column 222 (#4) includes the electron gun assembly 401, the first aperture plate 403, the deflector 405, the second aperture plate 406, the blocking cylinder 412, and the deflector 408. In the electron lens barrel 102, columns are mounted such that the lens systems such as the illumination lens 202, the projection lens 204, and the objective lens 207 are shared by the columns. In this case, a sub-system which controls an optical path for an independent electron beam is called a column.

In the pattern forming chamber 103, an X-Y stage 105 is movably arranged. On the X-Y stage 105, a target object 101 is placed. As the target object 101, for example, a wafer on which a semiconductor device is formed and an exposure mask used when a pattern is transferred onto a wafer are included. The mask also includes, for example, mask blanks on which any pattern is not yet formed. In the magnetic disk device 109, pattern forming data is stored. Here, in FIG. 1, only components needed to explain Embodiment 1 are shown in FIG. 1. The pattern forming apparatus 100 may include, other components usually needed for the pattern forming apparatus 100, as a matter of course.

Figure 2:
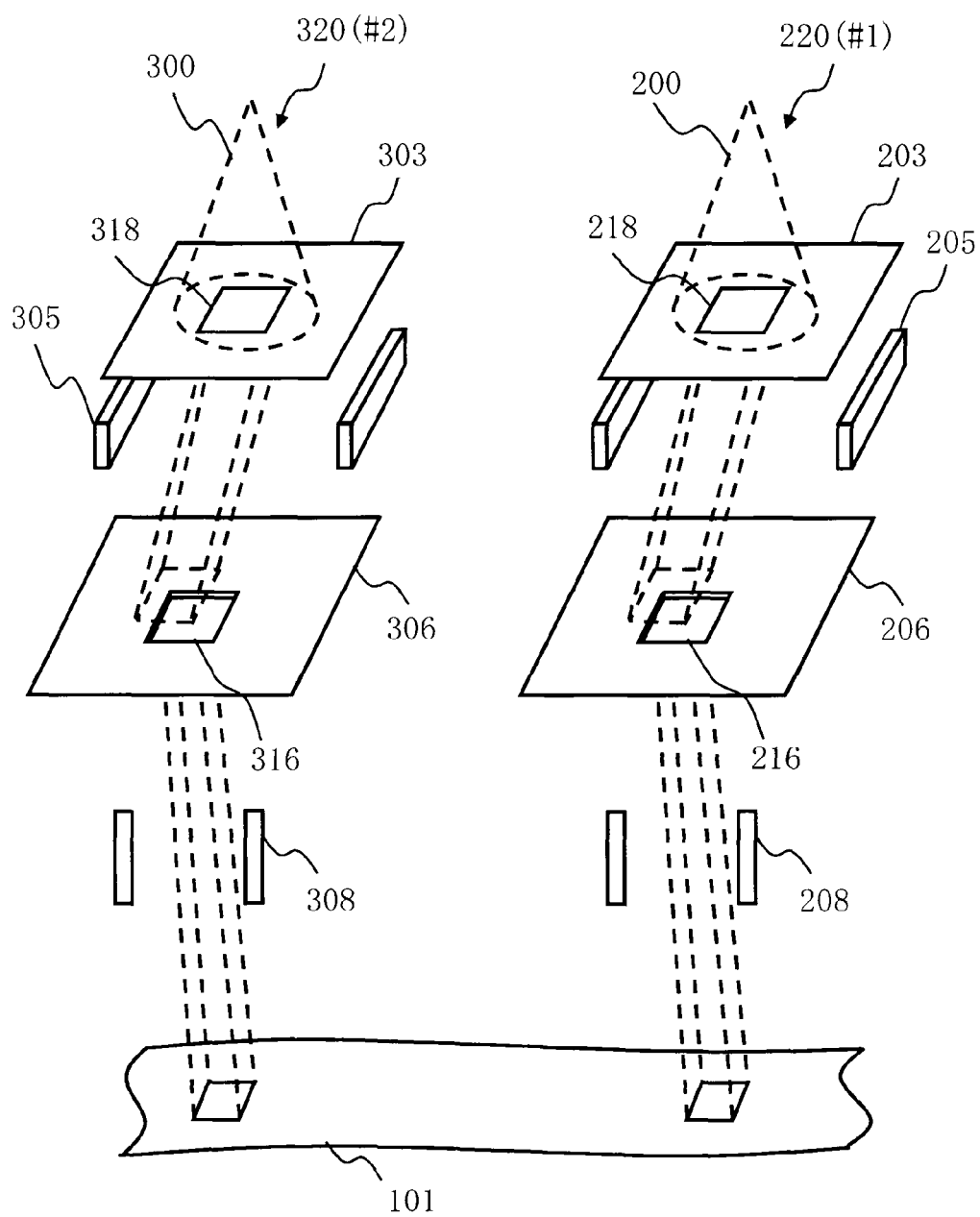
FIG. 2 is a conceptual diagram for explaining an operation of the pattern forming apparatus according to Embodiment 1.

FIG. 2 is a conceptual diagram for explaining an operation of a pattern forming apparatus according to Embodiment 1. An operation on the first column 220 side will be described first. An electron beam 200 emitted from the electron gun assembly 201 serving as an example of an irradiating unit illuminates an entire area of the first aperture plate 203 having a quadrangular, for example, rectangular opening 218 with the illumination lens 202. In this case, the electron beam 200 is shaped into a quadrangular, for example, rectangular shape. The electron beam 200 of a first aperture image having passed through the first aperture plate 203 is projected on the second aperture plate 206 by the projection lens 204. A position of the first aperture image on the second aperture plate 206 can be changed by controlling deflection of the beam by the deflector 205 so that a beam shape and a beam size to be defined by a shaping opening 216 can be changed. As a result, the electron beam 200 is shaped. In this manner, the electron beam 200 is shaped by leading the electron beam 200 having passed through the first aperture plate 203 to pass through a part of the shaping opening 216 of the second aperture plate 206. The electron beam 200 of the second aperture image having passed through the second shaping aperture plate 206 is focused by the objective lens 207 and deflected by the deflector 208. As a result, the electron beam 200 is irradiated onto a desired position of the target object 101 on the X-Y stage 105 which continuously moves. In this manner, a pattern is formed on the target object 101 by using the electron beam 200 by the first column 220.

As in the operation on the first column 220 side, on the second column 320 side, the following operation is performed. An electron beam 300 emitted from the electron gun assembly 301 serving as an example of an irradiating unit illuminates an entire area of the first aperture plate 303 having a quadrangular, for example, rectangular opening 318 with the illumination lens 202. In this case, the electron beam 300 is shaped into a quadrangular, for example, rectangular shape. The electron beam 300 of a first aperture image having passed through the first aperture plate 303 is projected on the second aperture plate 306 by the projection lens 204. A position of the first aperture image on the second aperture plate 306 can be changed by controlling deflection of the beam by the deflector 305 so that a beam shape and a beam size to be defined by a shaping opening 316 can be changed. As a result, the electron beam 300 is shaped. In this manner, the electron beam 300 is shaped by leading the electron beam 300 having passed through the first aperture plate 303 to pass through a part of the shaping opening 316 the second aperture plate 306. The electron beam 300 of the second aperture image having passed through the second shaping aperture plate 306 is focused by the objective lens 207 and deflected by the deflector 308. As a result, the electron beam 300 is irradiated onto a desired position of the target object 101 on the X-Y stage 105 which continuously moves. In this manner, a pattern is formed on the target object 101 by using the electron beam 200 by the second column 320.

Although not shown, the third column 322 and the fourth column 222 also operate like the first column 220 and the second column 320. With the operations, a pattern is formed on the target object 101 by using the electron beam 200 by the third column 322. Similarly, a pattern is formed on the target object 101 by using the electron beam 200 by the fourth column 222.

Figure 3:
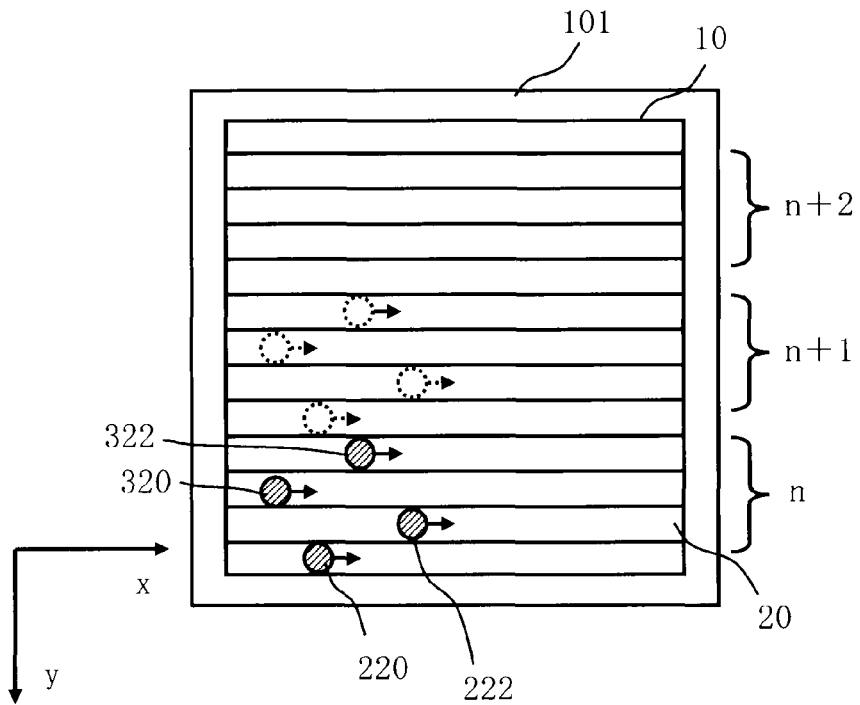
FIG. 3 is a conceptual diagram for explaining a flow of the pattern forming apparatus according to Embodiment 1.

FIG. 3 is a conceptual diagram for explaining a flow of pattern forming in Embodiment 1. In FIG. 3, a pattern forming region 10 of the target object 101 is virtually divided in y direction into, for example, a plurality of strip-shaped stripe regions 20 (example of small pattern forming regions) of a width same as deflectable width of each of the columns. By relative movements between the X-Y stage 105 and the columns 220, 320, 322, and 222, the respective columns 220, 320, 322, and 222 form patterns in the different stripe regions 20 in parallel with each other in an x direction. In this case, although the X-Y stage 105 continuously moves, the columns 220, 320, 322, and 222 may move. Also, the continuous movement is not necessary, and a step-and-repeat operation may be performed. FIG. 3 shows a case in which, in an n-th pattern forming operation, each of the columns 220, 320, 322, and 222 forms a pattern in a corresponding one of the four continuous stripe regions 20. This is indicated by a dotted line in FIG. 3. Upon completion of the n-th pattern forming operation, the columns 220, 320, 322, and 222 return to a pattern forming start position and also move in the y direction, and each of the columns 220, 320, 322, and 222 forms a pattern in the x direction in a corresponding one of the next four continuous stripe regions 20. FIG. 3 shows a case in which pattern forming is performed in the x direction. However, when the n-th pattern forming operation is performed in the x direction, an (n+1)-th pattern forming operation may be performed in a −x direction (reverse direction). As described above, the patterns are sequentially formed in the stripe regions 20.

Figure 4:
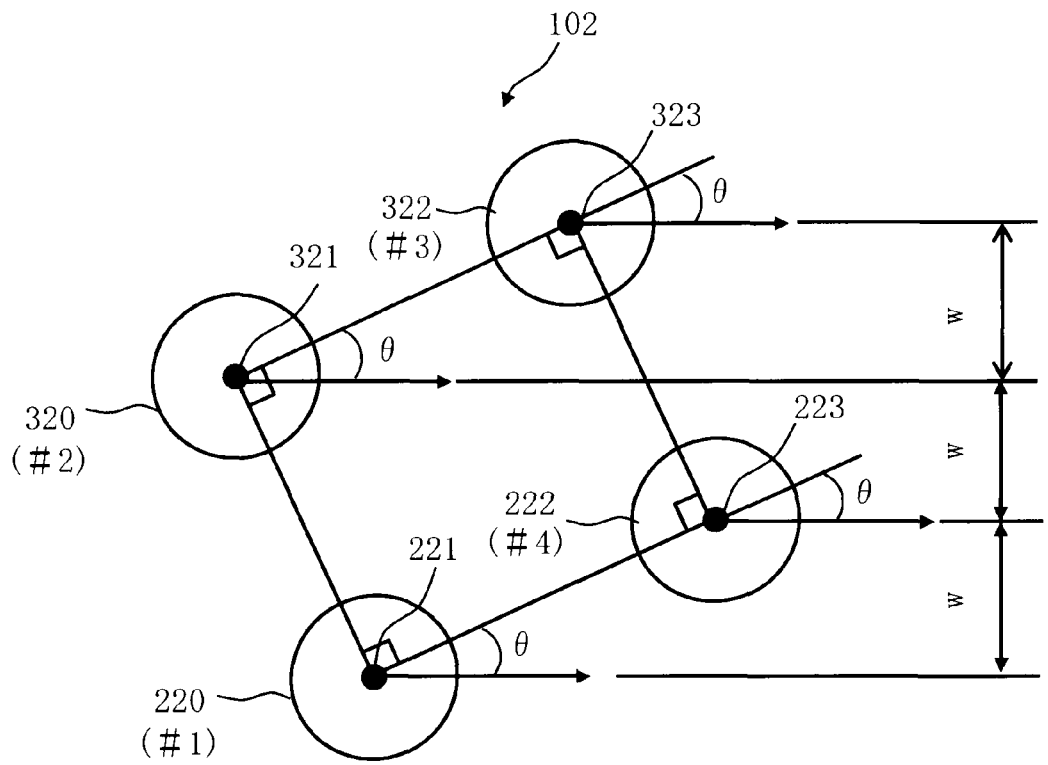
FIG. 4 is a diagram showing an example of a pattern forming direction in Embodiment 1.

FIG. 4 is a diagram showing an example of a pattern forming direction in Embodiment 1. In FIG. 4, in order to form patterns in the four stripe regions 20 by the four columns 220, 320, 322, and 222 in parallel with each other, pattern forming directions must be set such that distances w in the y direction between centers of columns which form patterns in adjacent stripe regions 20 are equal to each other. When a figure obtained by connecting the centers of the four columns 220, 320, 322, and 222 is a square, a side of the square in the x direction is inclined at an angle θ=26.5° with respect to the x direction. Accordingly, the distances w in the y direction between the centers of the columns which form patterns can be preferably made equal to each other.

Figure 5:
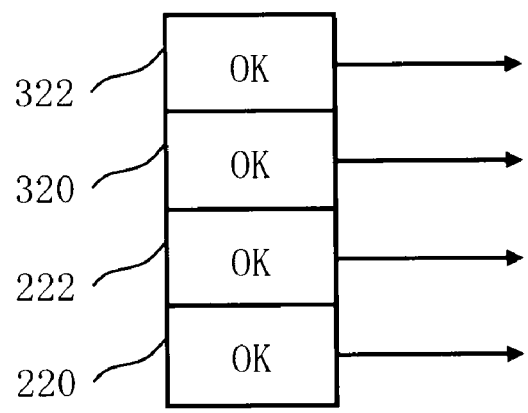
FIG. 5 is a conceptual diagram of an operation of the pattern forming apparatus according to Embodiment 1 without breakdown.

FIG. 5 is a conceptual diagram of a pattern forming operation without any broken column in Embodiment 1. The pattern forming operations by the four columns 220, 320, 322, and 222 shown in FIG. 4 can be regarded as substantially same as the pattern forming operations in which the four columns aligned in a vertical direction (y direction) form patterns. A pattern forming rule used when a breakdown occurs will be described below by using the alignment.

Figure 6:
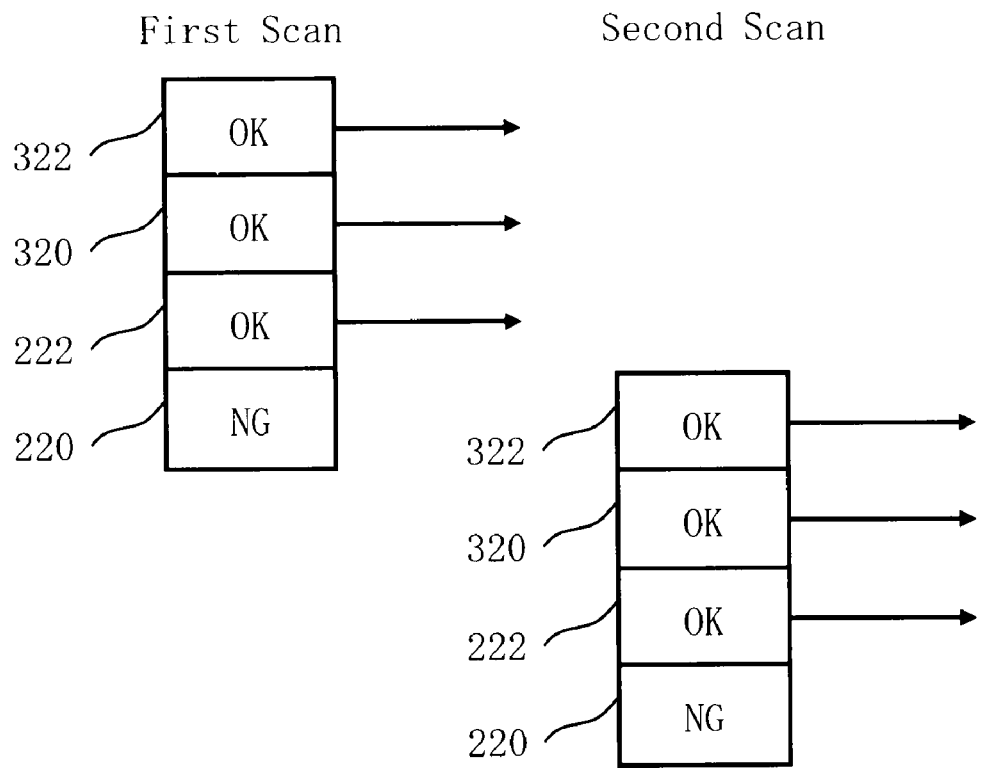
FIG. 6 is a conceptual diagram for explaining a pattern forming rule used when a breakdown occurs in an end column in Embodiment 1.

FIG. 6 is a conceptual diagram for explaining a pattern forming rule used when an end column is broken in Embodiment 1. As shown in FIG. 6, in a case that the first column 220 which is located at an end is broken when the plurality of columns 220, 320, 322, and 222 form patterns on the target object 101 in parallel in the x direction, the pattern forming rule setting unit 114 sets a pattern forming rule to form a pattern as described below. In the drawings following FIG. 6, "OK" indicates a column which is not broken, and "NG" indicates a broken column. The cases of breakdown include not only a case in which a breakdown occurs in a column itself as described above but also a case in which a breakdown occurs in control of an electron beam.

As an n-th pattern forming operation, the unbroken columns 320, 322, and 222 form patterns in the three stripe regions 20 of the target object 101 in parallel in the x direction at almost the same time. As an (n+1)-th pattern forming operation, at first, the columns are relatively moved by a length corresponding to the three stripe regions 20 in the y direction. The unbroken columns 320, 322, and 222 form patterns in the three stripe regions 20 of the target object in parallel in the x direction at almost the same time such that the column 322 located at the opposite end of the broken column 220 forms a pattern in the stripe region 20 located at a position of the broken column 220 in the n-th pattern forming operation. At this time, the column 320 forms a pattern in one of two new continuous stripe regions 20, and the column 222 forms a pattern in the other of the stripe regions 20. With the above operation, the pattern forming operation can be performed without generating a stripe region 20 in which a pattern is not formed. Furthermore, in this case, normal columns always operate, and thus the maximum efficiency seen this light is secured.

Figure 7:
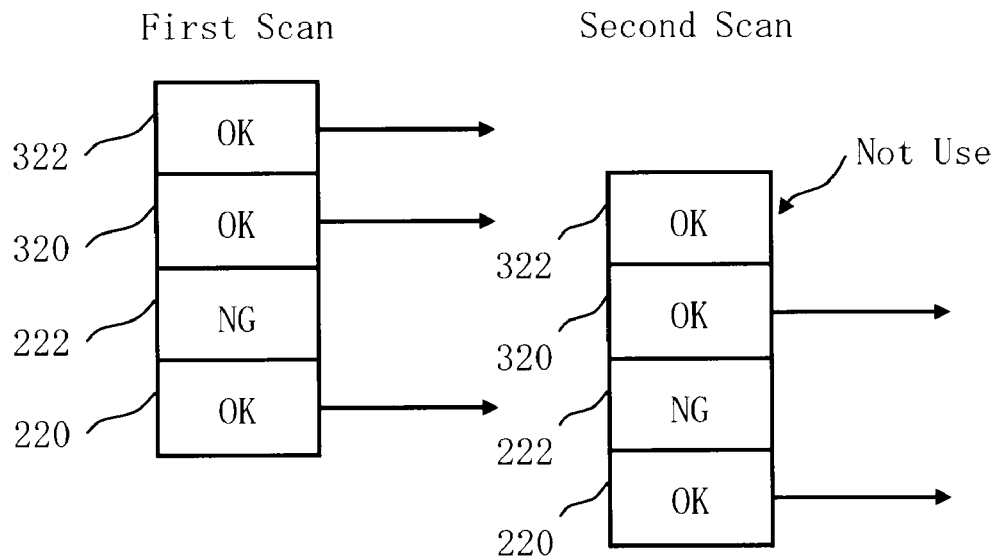
FIG. 7 is a conceptual diagram for explaining a pattern forming rule used when a central column which is not an end column is broken in Embodiment 1.

FIG. 7 is a conceptual diagram for explaining a pattern forming rule used when a central column which is not an end column is broken in Embodiment 1. As shown in FIG. 7, in a case that the column 222 which is located at a position which is not an end position is broken when the plurality of columns 220, 320, 322, and 222 form patterns on the target object 101 in parallel in the x direction, the pattern forming rule setting unit 114 sets a pattern forming rule to form a pattern as described below.

As the n-th pattern forming operation, the unbroken columns 320, 322, and 220 form patterns in the three stripe regions 20 of the target object 101 in parallel in the x direction at almost the same time. As an (n+1)-th pattern forming operation, at first, the columns are relatively moved by a length corresponding to one stripe region 20 in they direction. The unbroken column 320 forms a pattern in the stripe region 20 located at the position of the broken column 222 in the n-th pattern forming operation. Although the column 322 is not broken, the column stops the pattern forming operation while moving relatively to the X-Y stage 105. More specifically, in the (n+1)-th pattern forming operation, the column 322 is not used. The unbroken column 322 located in the stripe region 20 in which the pattern has already formed in advance in the n-th pattern forming operation stops the pattern forming operation while moving relatively to the X-Y stage 105. The column 220 forms a pattern in a new stripe region 20 at almost the same time with the column 320. With the above operation, the pattern forming operation can be performed without generating a stripe region 20 in which a pattern is not formed.

Figure 8:
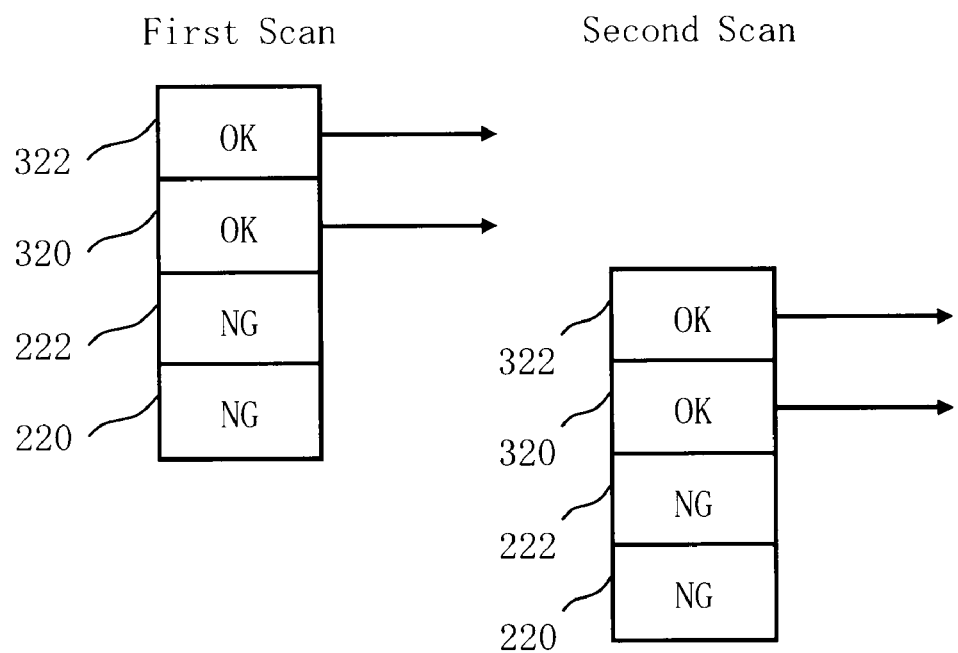
FIG. 8 is a conceptual diagram for explaining a pattern forming rule used when a plurality of continuous columns from an end are broken in Embodiment 1.

FIG. 8 is a conceptual diagram for explaining a pattern forming rule used when a plurality of continuous columns from an end are broken in Embodiment 1. As shown in FIG. 8, in a case that the plurality of continuous columns 220 and 222 from and end are broken when the plurality of columns 220, 320, 322, and 222 form patterns on the target object 101 in parallel in the x direction, the pattern forming rule setting unit 114 sets a pattern forming rule to form a pattern as follows.

As the n-th pattern forming operation, the unbroken columns 320 and 322 form patterns in the two adjacent stripe regions 20 of the target object 101 in parallel in the x direction at almost the same time. As an (n+1)-th pattern forming operation, at first, the columns are relatively moved by a length corresponding to the two stripe regions 20 in the y direction. The unbroken column 322 forms a pattern in the stripe regions 20 located at the position of the broken column 222 in the n-th pattern forming operation, and the unbroken column 320 forms a pattern in the stripe region 20 located at the position of the broken column 220 in the n-th pattern forming operation at almost the same time, respectively. With the above operation, the pattern forming operation can be performed without generating a stripe region 20 in which a pattern is not formed.

Figure 9:
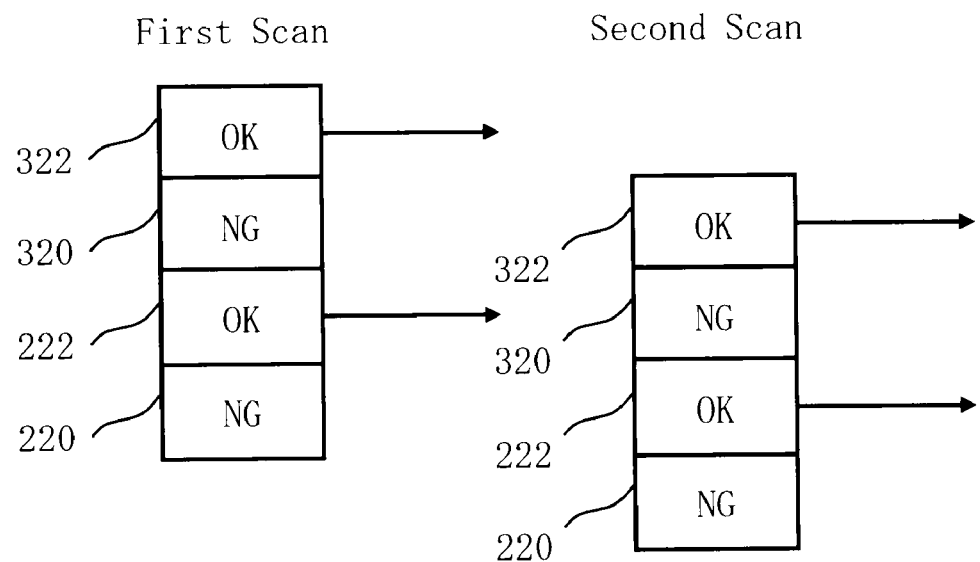
FIG. 9 is a conceptual diagram for explaining a pattern forming rule used in an example in which a plurality of discontinuous columns are broken in Embodiment 1.

FIG. 9 is a conceptual diagram for explaining a pattern forming rule used in an example in which a plurality of discontinuous columns are broken in Embodiment 1. As shown in FIG. 9, in a case that the column 320 is broken and the column 220 located across the column 222 is broken when the plurality of columns 220, 320, 322, and 222 form patterns on the target object 101 in parallel in the x direction, the pattern forming rule setting unit 114 sets a pattern forming rule to form a pattern as described below.

As the n-th pattern forming operation, the unbroken columns 322 and 222 form patterns in the two stripe regions 20 separated from each other across one stripe region 20 of the target objects 101 in parallel in the x direction at almost the same time. As an (n+1)-th pattern forming operation, at first, the columns are relatively moved by a length corresponding to one stripe region 20 in the y direction. The unbroken column 322 and the unbroken column 222 form patterns in the stripe region 20 located at the position of the broken column 320 in the n-th pattern forming operation and the stripe region 20 located at the position of the broken column 220 in the n-th pattern forming operation at almost the same time, respectively. With the above operation, the pattern forming operation can be performed without generating a stripe region 20 in which a pattern is not formed.

Figure 10:
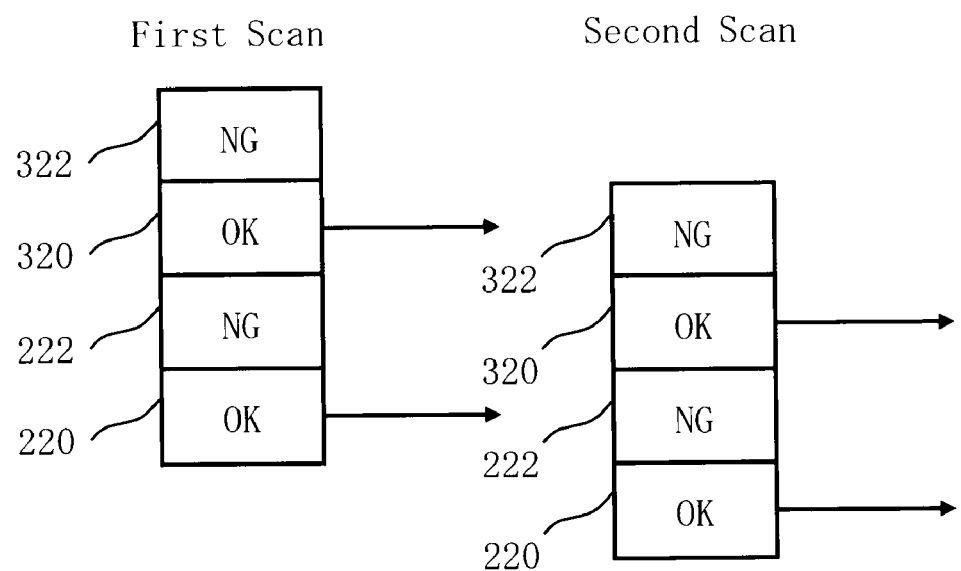
FIG. 10 is a conceptual diagram for explaining a pattern forming rule used in another example in which a plurality of discontinuous columns are broken in Embodiment 1.

FIG. 10 is a conceptual diagram for explaining a pattern forming rule used in another example in which a plurality of discontinuous columns are broken in Embodiment 1. As shown in FIG. 10, in a case that the column 320 is broken and the column 222 located across the column 320 is broken when the plurality of columns 220, 320, 322, and 222 form patterns on the target object 101 in parallel in the x direction, the pattern forming rule setting unit 114 sets a pattern forming rule to form a pattern as described below.

As the n-th pattern forming operation, the unbroken columns 320 and 220 form patterns in the two stripe regions 20 separated from each other across one stripe region 20 of the target objects 101 in parallel in the x direction at almost the same time. As the (n+1)-th pattern forming operation, at first, the columns are relatively moved by a length corresponding to one stripe region 20 in the y direction. The unbroken column 320 forms a pattern in the stripe region 20 located at the position of the broken column 222 in the n-th pattern forming operation. The column 220 forms a pattern in a new stripe region 20 at almost the same time as the column 320. As a matter of course, in the stripe regions 20 located at the position of the broken column 322 in the n-th pattern forming operation, a pattern is formed by the unbroken column 320 in advance in the (n−1)-th pattern forming operation. With the above operation, the pattern forming operation can be performed without generating a stripe region 20 in which a pattern is not formed.

Figure 11:
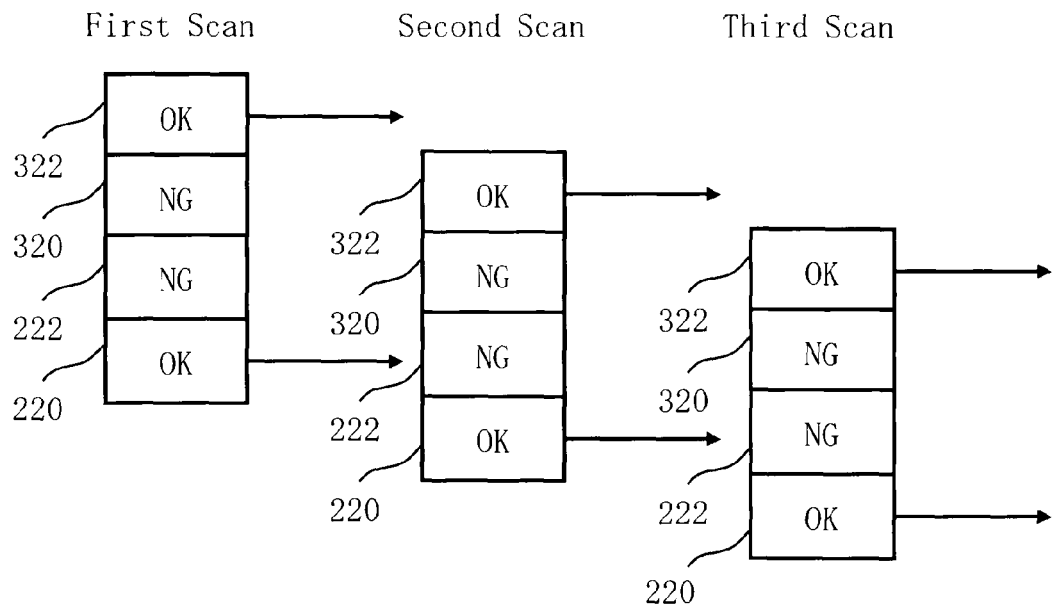
FIG. 11 is a conceptual diagram for explaining a pattern forming rule used when a plurality of central columns which are not columns at end are broken in Embodiment 1.

FIG. 11 is a conceptual diagram for explaining a pattern forming rule used when a plurality of central columns which are not columns at end are broken in Embodiment 1. As shown in FIG. 11, in a case that the plurality of columns 320 and 222 located at positions which are not ends are broken when the plurality of columns 220, 320, 322, and 222 form patterns on the target object 101 in parallel in the x direction, the pattern forming rule setting unit 114 sets a pattern forming rule to form a pattern as described below.

As the n-th pattern forming operation, the unbroken columns 322 and 220 form patterns in the two stripe regions 20 separated from each other across two stripe regions 20 of the target objects 101 in parallel in the x direction at almost the same time. As the (n+1)-th pattern forming operation, at first, the columns are relatively moved by a length corresponding to one stripe region 20 in the y direction. The unbroken column 322 forms a pattern in the stripe region 20 located at the position of the broken column 320 in the n-th pattern forming operation and the unbroken column 220 forms a new stripe region 20 at almost the same time. As the (n+2)-th pattern forming operation, at first, the columns are relatively moved by a length corresponding to one stripe region 20 in the y direction. The unbroken column 322 forms a pattern in the stripe region 20 located at the position of the broken column 222 in the n-th pattern forming operation and the unbroken column 220 forms a new stripe region 20 at almost the same time. With the above operation, the pattern forming operation can be performed without generating a stripe region 20 in which a pattern is not formed.

As breakdown information, a breakdown may be detected in the pattern forming apparatus 100 and the detected matter may be input to the pattern forming rule setting unit 114. Alternatively, information of a broken column may be input from the outside. A flow of steps in a pattern forming method is described hereinafter.

As a pattern forming rule setting step, the pattern forming rule setting unit 114 receives breakdown information of a column and sets the above pattern forming rule depending on a position of a broken column in the pattern forming apparatus 100 including a plurality of columns.

As a region setting step, the region setting unit 116 receives data of the set pattern forming rule and sets stripe regions 20 so that unbroken columns respectively form a pattern in one of the stripe regions 20 set, according to the pattern forming rule.

As a pattern forming data processing step, the pattern forming data processing unit 112 reads pattern forming data for the set region from the magnetic disk device 109 and performs a plurality of data conversion processes to convert the pattern forming data into format data (shot data) unique to the apparatus. Then the converted corresponding shot data is output to the corresponding deflection control circuit of each corresponding unbroken column through the buffer memory. When the converted shot data is data of the stripe region 20 in which a pattern is formed by the column 220, for example, the shot data is output to the buffer memory 130 and temporarily stored in the buffer memory 130. When the converted shot data is data of a stripe region 20 in which a pattern is formed by the column 320, for example, the shot data is output to the buffer memory 132 and temporarily stored in the buffer memory 132. When the converted shot data is data of a stripe region 20 in which a pattern is formed by the column 322, for example, the shot data is output to the buffer memory 136 and temporarily stored in the buffer memory 136. When the converted shot data is data of a stripe region 20 in which a pattern is formed by the column 222, for example, the shot data is output to the buffer memory 134 and temporarily stored in the buffer memory 134.

As the pattern forming step, the deflection control circuit 120 reads the shot data from the buffer memory 130 and applies a deflection voltage for position control to the deflector 208 according to the shot data. Although not shown, the deflection control circuit 120 applies a deflection voltage for shaping to the deflector 205. The deflection control circuit 122 reads the shot data from the buffer memory 132 and applies a deflection voltage for position control to the deflector 308 according to the shot data. Although not shown, the deflection control circuit 122 applies a deflection voltage for shaping to the deflector 305 according to the shot data. The deflection control circuit 124 read the shot data from the buffer memory 134 and applies a deflection voltage for position control to the deflector 408 according to the shot data. Although not shown, the deflection control circuit 124 applies a deflection voltage for shaping to the deflector 405 according to the shot data. The deflection control circuit 126 reads the shot data from the buffer memories 136 and applies a deflection voltage for position control to the deflector 508 according to the shot data. Although not shown, the deflection control circuit 126 applies a deflection voltage for shaping to the deflector 505 according to the shot data. Each of the plurality of deflection control circuits 120, 122, 124, and 126 control any one of the plurality of columns 220, 320, 322, and 222 which is different from columns controlled by other deflection control circuits. The pattern forming unit 150 forms patterns on the target object 101 by using the electron beams by using unbroken columns while moving relatively to the X-Y stage 105 on which the target object 101 is placed.

In Embodiment 1, the pattern forming apparatus 100 on which the four columns 220, 320, 322, and 222 are mounted is described. However, the number of columns is not limited to four. The number of columns may be larger or smaller than four as long as a plurality of columns is used.

Figure 12:
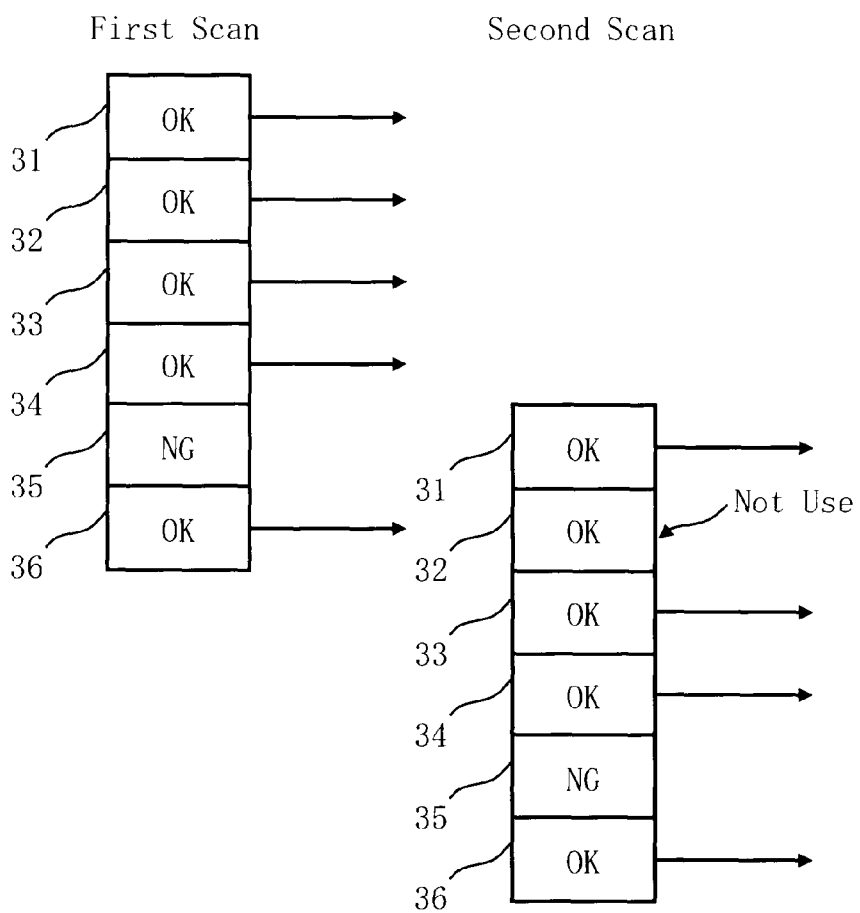
FIG. 12 is a conceptual diagram showing an example of a pattern forming rule of a pattern forming apparatus on which six columns are mounted.

FIG. 12 is a conceptual diagram showing an example of a pattern forming rule of a pattern forming apparatus on which six columns are mounted. For example, as shown in FIG. 12, when a column 35 to be located at a second position from an end is broken when six columns 31, 32, 33, 34, 35, and 36 form patterns on the target object 101 in parallel in the x direction, the pattern forming rule setting unit 114 sets a pattern forming rule to form a pattern as described below.

As an n-th pattern forming operation, the unbroken columns 31, 32, 33, 34, and 36 form patterns in five stripe regions 20 of the target object 101 in parallel in the x direction at almost the same time. As an (n+1)-th pattern forming operation, at first, the columns are relatively moved by a length corresponding to four stripe regions 20 in the y direction. The unbroken column 31 forms a pattern in the stripe region 20 located at a position of the broken column 35 in the n-th pattern forming operation. The operation of the column 32 located at the stripe regions 20 in which a pattern is formed in advance in the n-th pattern forming operation stops the operation. The columns 33, 34, and 36 form patterns in three new stripe regions 20 at almost the same time with the column 31. With the above operation, the pattern forming operation can be performed without generating a stripe region 20 in which a pattern is not formed.

As described above, according to Embodiment 1, even when a breakdown in a column occurs in the pattern forming apparatus 100 of a multi-column system, a pattern forming operation can be performed without any missing pattern. Therefore, the operation of the apparatus is not stopped. As a result, a pattern forming time can be shortened.

Embodiment 2

In Embodiment 1, a configuration in which one column forms a pattern in each strip-shaped stripe region is described. In Embodiment 2, a configuration in which patterns are formed in regions obtained by virtually dividing the pattern forming region 10 of the target object 101, respectively is described. The configuration of the pattern forming apparatus 100 is the same as that in FIG. 1. The steps in the pattern forming method are also the same as those in Embodiment 1. The pattern forming method is the same as that in Embodiment 1 except for the following matters.

Figure 13:
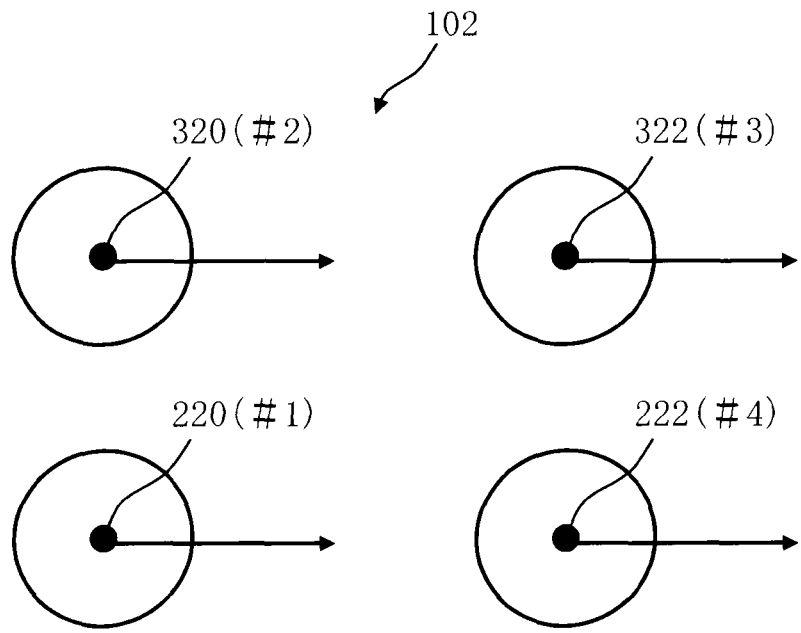
FIG. 13 is a conceptual diagram for explaining a pattern forming direction in Embodiment 2.

FIG. 13 is a conceptual diagram for explaining a pattern forming direction in Embodiment 2. In Embodiment 1, first to fourth columns 220, 320, 322, and 222 arranged in (2×2) array having two horizontal lines and two vertical lines are arranged to be inclined at an angle θ with respect to the x direction. However, in Embodiment 2, as shown in FIG. 13, the first to fourth column are arranged without being inclined. Therefore, the columns 220 and 222 are located at positions to move forward and backward in the x direction on the same axis. The columns 320 and 322 are located at positions to move forward and backward in the x direction on the same axis. The columns 220 and 320 are located at positions to move forward and backward in the y direction on the same axis, and the column 222 and 322 are located at positions to move forward and backward in the y direction on the same axis. Also in Embodiment 2, patterns are formed in the x direction.

Figure 14:
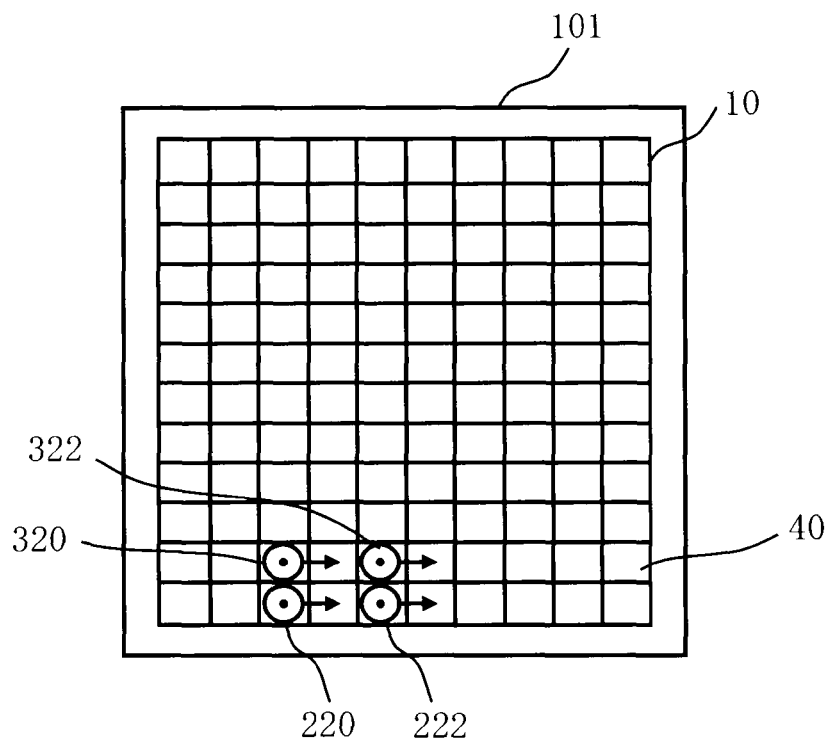
FIG. 14 is a conceptual diagram for explaining a chip region and a pattern forming direction in Embodiment 2.

FIG. 14 is a conceptual diagram for explaining a chip region and a pattern forming direction in Embodiment 2. The pattern forming region 10 of the target object 101 is virtually divided into a plurality of meshed chip regions 40 (example of small pattern forming regions). Typically, a plurality of chip patterns is formed on the target object 101. FIG. 14 shows an example in which a plurality of chips is arranged. In a pattern forming operation, the plurality of chips are merged and virtually divided into stripe regions 20. Therefore, each of the chip regions 40 is virtually divided into a plurality of stripe regions in the y direction, for example, and the pattern forming operation may be performed for every stripe width. In drawings of Embodiment 2 following FIG. 14, a stripe region is not shown for easier understanding of the content. The drawings subsequent in FIG. 14 in Embodiment 2 show a case in which one column forms a pattern on one chip. Therefore, in FIG. 14, the four columns 220, 320, 322, and 222 form patterns in the four regions 40 at almost the same time, respectively. In the drawings of Embodiment 2 following FIG. 14, the two columns 220 and 222 are positioned on the same axis in the x direction across one chip region 40, and the two columns 320 and 322 are located on the same axis in the x direction across one chip region 40.

Figure 15:
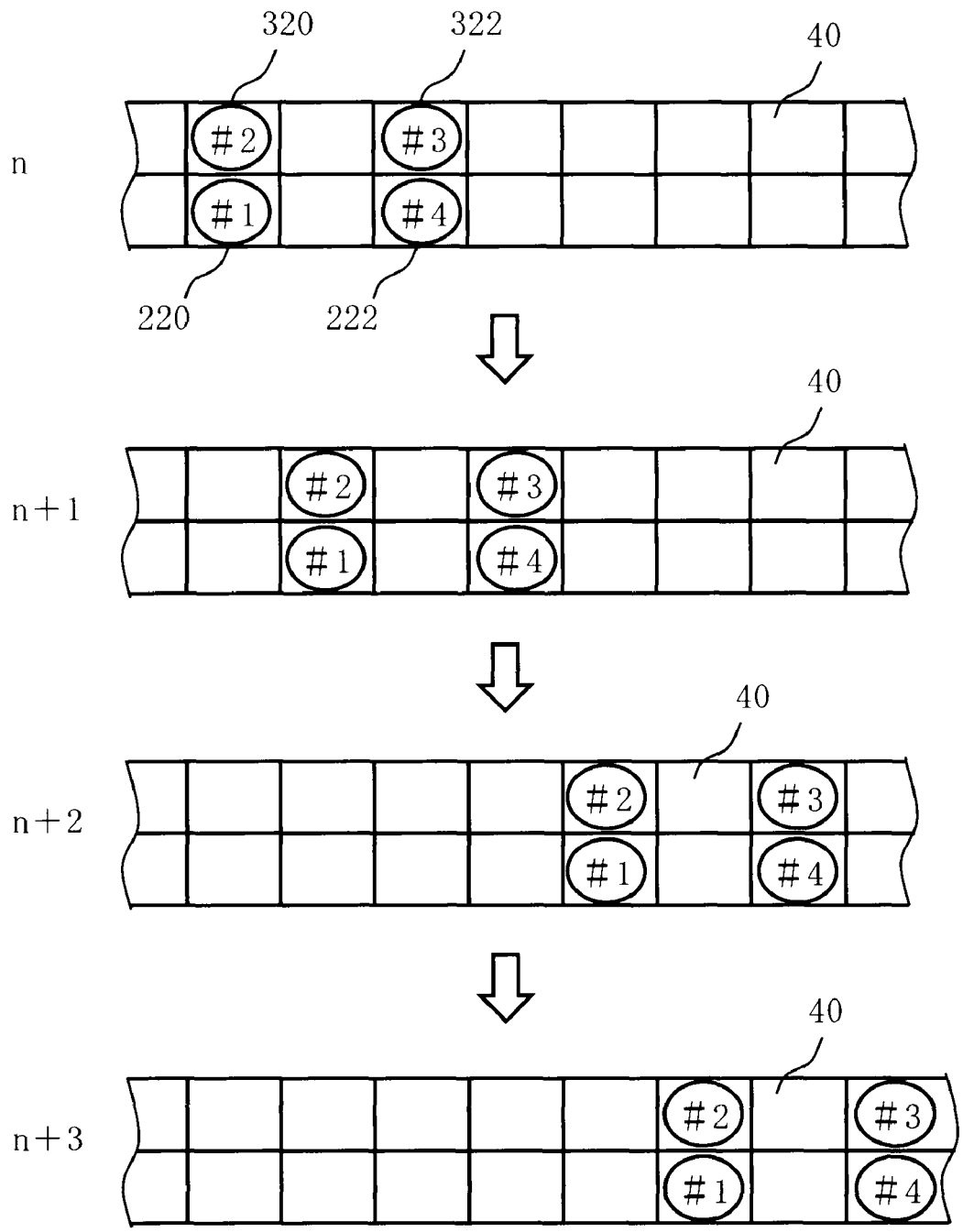
FIG. 15 is a conceptual diagram for explaining a pattern forming rule used when no column is broken in Embodiment 2.

FIG. 15 is a conceptual diagram for explaining a pattern forming rule used when no column is broken in Embodiment 2. As an n-th pattern forming operation, at first, the columns 220 and 222 form patterns in two chip regions 40 arranged on the same axis in the x direction across one chip region 40 at almost the same time. The columns 320 and 322 then form patterns in two chip regions 40 arranged at positions on the same axis in the x direction across one chip region 40 and positions respectively shifted by a length corresponding to one chip region in the y direction at almost the same time. As an (n+1)-th pattern forming operation, the columns are relatively moved by a length corresponding to one chip region in the x direction. The columns 220 and 222 form patterns in two chip regions 40 arranged on the same axis in the x direction across one chip region 40 at almost the same time. And, then the columns 320 and 322 form patterns in two chip regions 40 arranged at an positions on the same axis in the x direction across one chip region 40 and positions respectively shifted by a length corresponding to one chip region in the y direction at almost the same time. More specifically, since the columns continuously move in the x direction, after the n-th pattern forming operation, continuously, the (n+1)-th pattern forming operation is performed. Then, as an (n+2)-th pattern forming operation, at first, the columns are relatively moved by a length corresponding to three chip regions in the x direction. The columns 220 and 222 form patterns in two chip regions 40 arranged on the same axis in the x direction across one chip region 40 at almost the same time. The columns 320 and 322 form patterns in two chip regions 40 arranged at positions on the same axis in the x direction across one chip region 40 and positions respectively shifted by a length corresponding to one chip region in the y direction at almost the same time. More specifically, since the columns continuously move in the x direction, after the (n+1)-th pattern forming operation, the pattern forming operation is stopped until the columns are relatively moved by a length corresponding to three chip regions in the x direction. As an (n+3)-th pattern forming operation, the columns are relatively moved by a length corresponding to one chip region in the x direction. The columns 220 and 222 form patterns in two chip regions 40 arranged on the same axis in the x direction across one chip region 40 at almost the same time. The columns 320 and 322 form patterns in two chip regions 40 arranged at positions on the same axis in the x direction across one chip region 40 and positions respectively shifted by a length corresponding to one chip region in the y direction at almost the same time.

Figure 16:
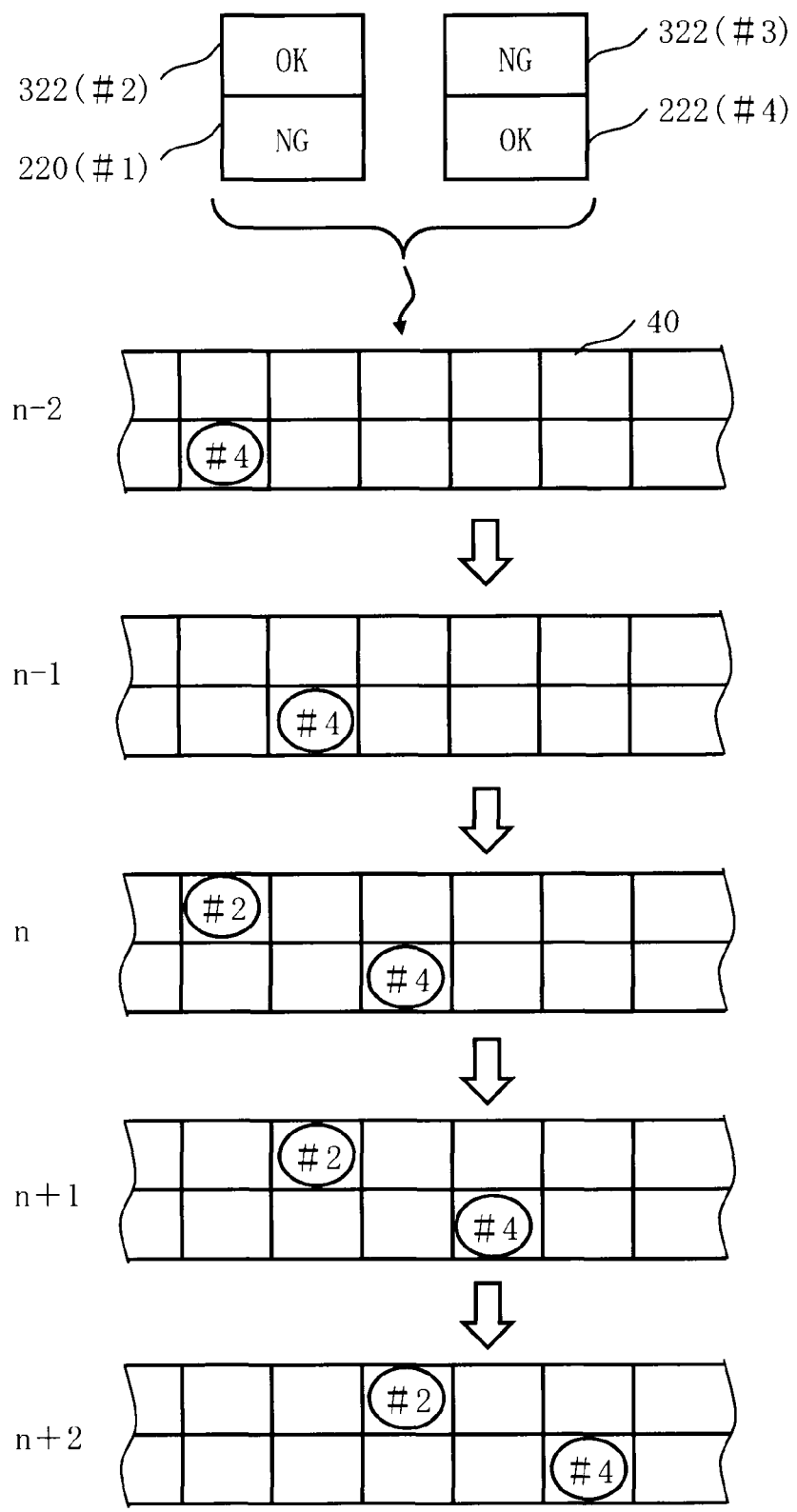
FIG. 16 is a conceptual diagram for explaining a pattern forming rule used when two columns in diagonal relationship are broken in Embodiment 2.

FIG. 16 is a conceptual diagram for explaining a pattern forming rule used when two columns in diagonal relationship are broken in Embodiment 2. As shown in FIG. 16, in a case that the two columns 220 and 322 in diagonal relationship are broken when the plurality of columns 220, 320, 322, and 222 form patterns on the target object 101 in the x direction at almost the same time, the pattern forming rule setting unit 114 sets a pattern forming rule to form a pattern as described below.

As the n-th pattern forming operation, the columns 322 and 222 form patterns in two chip regions 40 arranged at positions shifted from each other by a length corresponding to one chip region 40 in the y direction and shifted from each other to allow for a space of one chip region 40 in the x direction at almost the same time. As the (n+1)-th pattern forming operation, the columns are relatively moved by a length corresponding to one chip region in the x direction. The columns 322 and 222 form patterns in two chip regions 40 arranged at positions shifted from each other by a length corresponding to one chip region 40 in the y direction and shifted from each other to allow for a space of one chip region 40 in the x direction at almost the same time. More specifically, since the columns continuously move in the x direction, after the n-th pattern forming operation, continuously, the (n+1)-th pattern forming operation is performed. As an (n+2)-th pattern forming operation, the columns are relatively moved by a length corresponding to one chip regions in the x direction. The columns 322 and 222 form patterns in two chip regions 40 arranged at positions shifted from each other by a length corresponding to one chip region 40 in the y direction and shifted from each other to allow for a space of one chip region 40 in the x direction at almost the same time. With respect to the end chip region 40, as shown in an (n−2)-th pattern forming operation, the unbroken column 222 forms a pattern first and sequentially advances in the x direction. With the above operation, the pattern forming operation can be performed without generating the chip region 40 in which a pattern is not formed. A drop of a throughput is advantageously only 1/2 that is a ratio of the number of broken columns (=the number of unbroken columns/the number of all columns).

Figure 17:
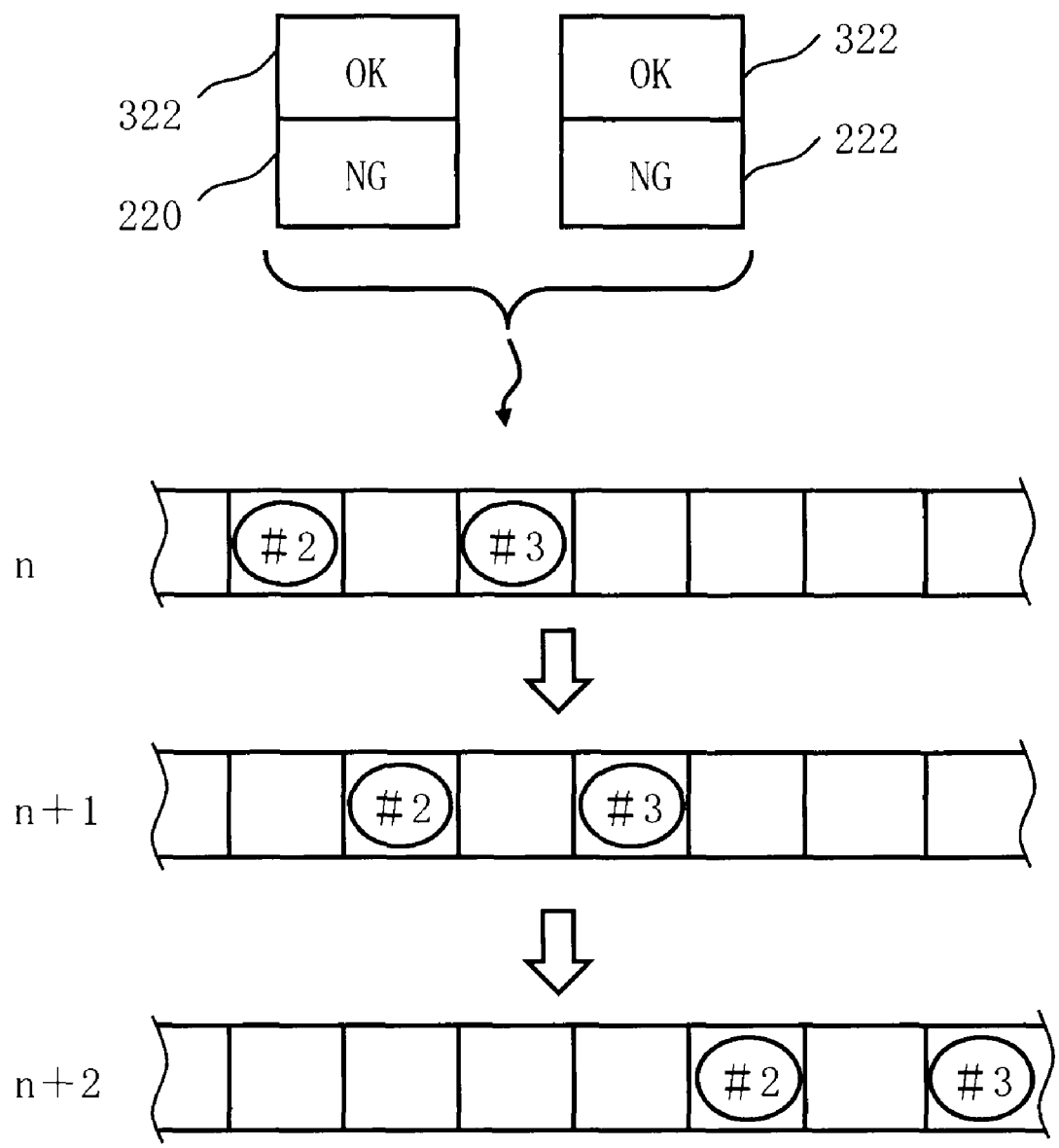
FIG. 17 is a conceptual diagram for explaining a pattern forming rule used when two adjacent columns are broken in Embodiment 2.

FIG. 17 is a conceptual diagram for explaining a pattern forming rule used when two adjacent columns are broken in Embodiment 2. As shown in FIG. 17, in a case that the two columns 220 and 222 adjacent to each other in the x direction are broken when the plurality of columns 220, 320, 322, and 222 form patterns on the target object 101 in the x direction at almost the same time, the pattern forming rule setting unit 114 sets a pattern forming rule to form a pattern as described below.

As the n-th pattern forming operation, the columns 320 and 322 form patterns in two chip regions 40 arranged on the same axis in the x direction across one chip region 40 at almost the same time. As the (n+1)-th pattern forming operation, the columns are relatively moved by a length corresponding to one chip region in the x direction. The columns 322 and 222 form patterns in two chip regions 40 arranged on the same axis in the x direction across one chip region 40 at almost the same time. More specifically, since the columns continuously move in the x direction, after the n-th pattern forming operation, continuously, the (n+1)-th pattern forming operation is performed. As an (n+2)-th pattern forming operation, the columns are relatively moved by a length corresponding to three chip regions in the x direction. The columns 320 and 322 form patterns in two chip regions 40 arranged on the same axis in the x direction across one chip region 40 at almost the same time. More specifically, since the columns continuously move in the x direction, after the (n+1)-th pattern forming operation, the pattern forming operation is stopped until the columns are relatively moved by a length corresponding to three chip regions in the x direction. With the above operation, the pattern forming operation can be performed without generating the chip region 40 in which a pattern is not formed. A drop of a throughput is advantageously only 1/2 that is a ratio of the number of broken columns (=the number of unbroken columns/the number of all columns).

Figure 18:
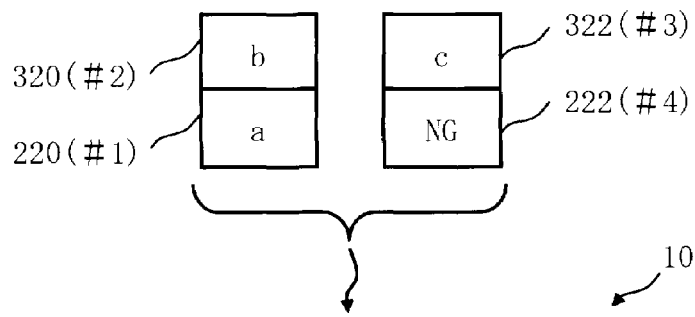
FIG. 18 is a conceptual diagram for explaining a pattern forming rule used when a fourth column of first to fourth columns arranged in (2×2) array having two horizontal lines and two vertical lines in Embodiment 2.

FIG. 18 is a conceptual diagram for explaining a pattern forming rule used when the fourth columns of the first to fourth columns arranged in (2×2) array having two horizontal lines and two vertical lines in Embodiment 2. In FIG. 18, reference symbol "a" denotes a chip region 40 in which a pattern is formed by the first column 220. Reference symbol "b" denotes a chip region 40 in which a pattern is formed by the second column 320. Reference symbol "c" denotes a chip region 40 in which a pattern is formed by the third column 322. Numbers following the reference symbols "a", "b", and "c" denote the numbers of times of a pattern forming operation. Coordinates (i, j) indicate a position of the chip region 40 in a pattern forming region 10 of the target object 101.

As shown in FIG. 18, in a case that the fourth column 222 is broken when the plurality of columns 220, 320, 322, and 222 form patterns on the target object 101 in the x direction at almost the same time, the pattern forming rule setting unit 114 sets a pattern forming rule as described below. In FIG. 18, in a pattern forming operation, the first and second columns are arranged in this order in the y direction and the fourth and third columns are arranged in this order in the x direction. The fourth column is arranged in the x direction from the first column, and the third column is arranged in the x direction from the second column.

For example, as the (n−1)-th pattern forming operation, the first column 220, the second column 320 and the third column 322 forms a pattern in a chip region 40 at coordinates (i−3, j), the second column 320 forms a pattern in a chip region at coordinates (i−3, j+1) and the third column 322 forms a pattern in a chip region at coordinates (i−1, j+1) at almost the same time, respectively. As the n-th pattern forming operation, the columns are relatively moved by a length corresponding to three chip regions in the x direction. As the n-th pattern forming operation, the first column 220 forms a pattern in a chip region 40 at coordinates (i, j), the second column 320 forms a pattern in a chip region 40 at coordinates (i, j+1), and the third column 322 forms a pattern in a chip region 40 at a coordinate (i+2, j+1) at almost the same time, respectively. In this manner, after the columns form patterns up to the end chip region 40 while advancing in the x direction, the columns are relatively moved by a length corresponding to one chip region in the y direction. Similarly, the columns form patterns in the chip regions 40 in which patterns are not formed while advancing in the x direction. As an (n+m)-th pattern forming operation, the first column 220 are relatively moved in the x direction from a position where a pattern can be formed in the chip region 40 at coordinates (i−2, j+1) to a position where a pattern can be formed in the chip region 40 at coordinates (i+1, j+1). The first column 220 forms a pattern in the chip region 40 at coordinates (i+1, j+1), the second column 320 forms a pattern in the chip region 40 at coordinates (i+1, j+2), and the third column 322 forms a pattern in the chip region 40 at coordinates (i+3, j+2) at almost the same time, respectively. When a pattern is formed in the chip region 40 close to an end, the corresponding column of the three unbroken columns forms a pattern, and a column which is located outside the pattern forming region may stop a pattern forming operation.

FIG. 18 shows a case in which a pattern forming region is divided into (8×10) chip regions 40 in the x and y directions. In this case, as a first pattern forming operation, the third column 322 forms a pattern in the chip region 40 at coordinates (2, 1). At this time, since the columns 220 and 320 are located outside the pattern forming region 10, the columns 220 and 320 are set in a standby state without performing a pattern forming operation. Subsequently, as a second pattern forming operation, the columns are relatively moved by a length corresponding to three chip regions in the x direction. The third column 322 also forms a pattern in the chip region 40 at coordinates (5, 1). Since the columns 220 and 320 are still located outside the pattern forming region 10, the columns 220 and 320 are set in a standby state without performing a pattern forming operation.

Subsequently, as a third pattern forming operation, the columns are relatively moved by a length corresponding to three chip regions in the x direction. The third column 322 forms a pattern in the chip region 40 at coordinates (8, 1). Since the columns 220 and 320 are still located outside the pattern forming region 10, the columns are set in a standby state without performing a pattern forming operation. The columns are relatively moved by a length corresponding to one chip region in the y direction. Then the columns are relatively moved in the x direction to positions allowing the first column 220 to form a pattern in the chip region 40 at coordinates (1, 1). As a fourth pattern forming operation, the first column 220, the second column 320, and the third column 322 form patterns in the chip region 40 at coordinates (1, 1), the chip region 40 at coordinates (1, 2), and the chip region 40 at coordinates (3, 2) at almost the same time, respectively.

Subsequently, as a fifth pattern forming operation, the columns are relatively moved in the x direction by a length corresponding three chip regions. The first column 220, the second column 320, and the third column 322 form patterns in the chip region 40 at coordinates (4, 1), the chip region 40 at coordinates (4, 2), and the chip region 40 at coordinates (6, 2) at almost the same time, respectively. Subsequently, as a sixth pattern forming operation, the columns are relatively moved in the x direction by a length corresponding to three chip regions. The first column 220 and the second column 320 form patterns in the chip region 40 at coordinates (7, 1) and the chip region 40 at coordinates (7, 2) at almost the same time, respectively. At this time, since the third column 322 is located outside the pattern forming region 10, the third column 322 is set in a standby state without performing a pattern forming operation. The columns 322 are relatively moved by a length corresponding to one chip region in the y direction. Then, the columns are relatively moved in the x direction to positions allowing the third column 322 to form a pattern in the chip region 40 at coordinates (1, 3).

As a seven-th pattern forming operation, the third column 322 forms a pattern in the chip region 40 at coordinates (1, 3). At this time, since the columns 220 and 320 are located outside the pattern forming region 10, the columns 220 and 320 are set in a standby state without performing a pattern forming operation. Subsequently, as an eighth pattern forming operation, the columns are relatively moved in the x direction by a length corresponding to three chip regions. The first column 220, the second column 320, and the third column 322 form patterns in the chip region 40 at coordinates (2, 2), the chip region 40 at coordinates (2, 3), and the chip region 40 at coordinates (4, 3) at almost the same time, respectively. Subsequently, as a ninth pattern forming operation, the columns are relatively moved in the x direction by a length corresponding to three chip regions. The first column 220, the second column 320, and the third column 322 form patterns in the chip region 40 at coordinates (5, 2), the chip region 40 at coordinates (5, 3), and the chip region 40 at coordinates (7, 3) at almost the same time, respectively.

Subsequently, as a tenth pattern forming operation, the columns are relatively moved in the x direction by a length corresponding to three chip regions. The first column 220 and the second column 320 form patterns in the chip region 40 at coordinates (8, 2) and the chip region 40 at coordinates (8, 3) at almost the same time, respectively. At this time, since the third column 322 is located outside the pattern forming region 10, the third column 322 is set in a standby state without performing a pattern forming operation.

With the pattern forming operation as described above, the pattern forming operation can be performed without generating a chip region 40 in which a pattern is not formed up to second line in the y direction.

The same operation as described above is repeated to 36th pattern forming operations, whereby patterns can be formed in all the (8×10) chip regions 40. In FIG. 18, a pattern forming region is divided into (8×10) chip regions 40. However, the number of chip regions is not limited to 8×10. The number of chip regions 40 may be larger or smaller than 8×10 to attain the same effect as described above. When the pattern forming operation is performed according to the pattern forming rule, a drop of a throughput is advantageously only 3/4 which is a ratio of the number of unbroken columns (=(the number of unbroken columns)/(the number of all columns)). Furthermore, when a pattern forming operation is performed in a central portion in FIG. 18, normal columns always operate, and thus the maximum efficiency seen this light is secured.

Figure 19:
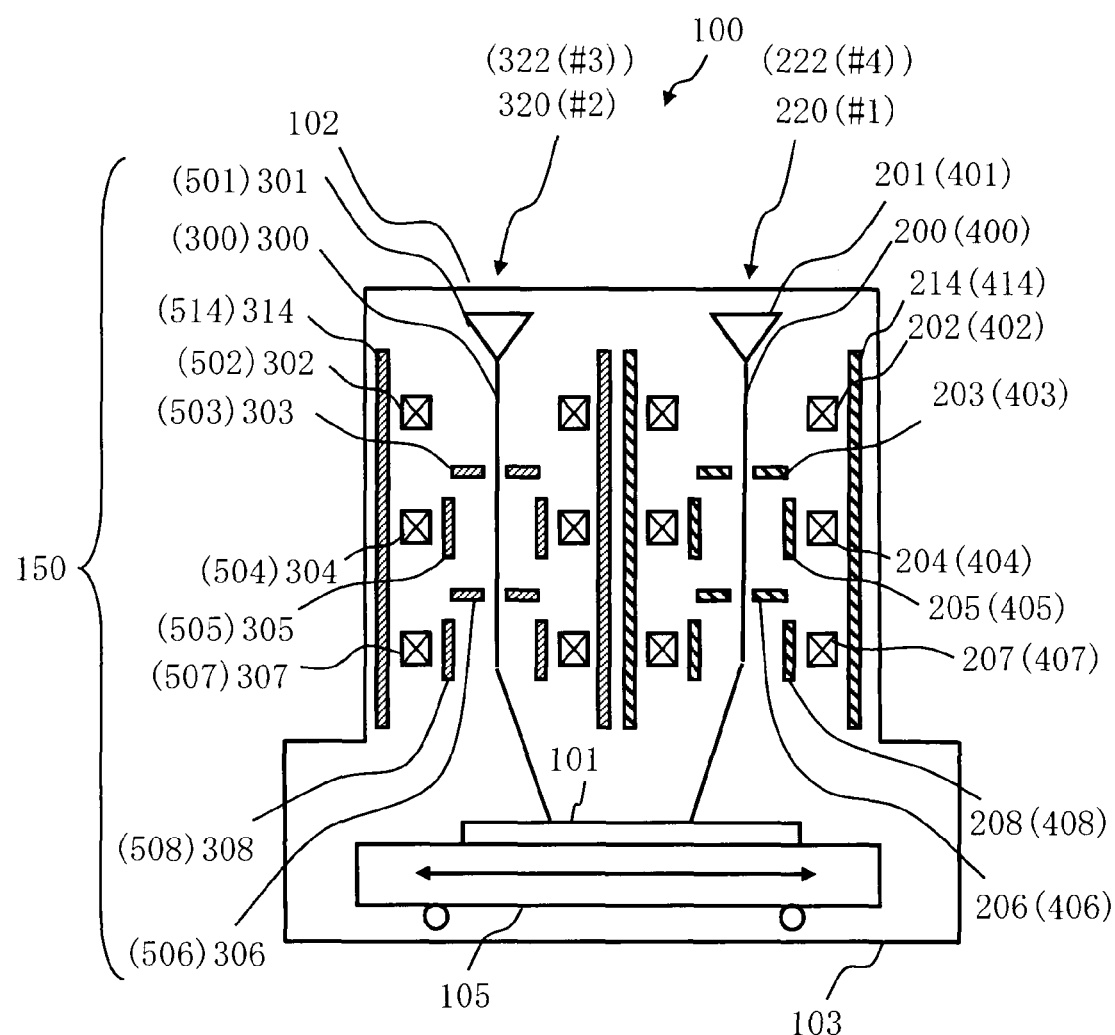
FIG. 19 is a conceptual diagram showing a configuration of a pattern forming apparatus on which a multi-column system is mounted independently of a lens system.

In the above explanation, the pattern forming apparatus 100 including the multi-column system described in Embodiments 1 and 2 is configured that electronic lenses are shared by columns. However, another configuration may be used. FIG. 19 is a conceptual diagram showing a configuration of a pattern forming apparatus including a multi-column system having independent lens systems. In FIG. 19, as an example, a case in which a multi-column of four columns 220, 320, 322, and 222 corresponding to FIG. 1 is used is shown. Although a control system is not shown, the same control system as in FIG. 1 is used. The first column 220 includes the electron gun assembly 201, the illumination lens 202, the first aperture plate 203, the projection lens 204, the deflector 205, the second aperture plate 206, the objective lens 207, the deflector 208, and an insulating column 214. The second column 320 includes the electron gun assembly 301, an illumination lens 302, the first aperture plate 303, a projection lens 304, the deflector 305, the second aperture plate 306, an objective lens 307, the deflector 308, and an insulating column 314. The third column 322 includes the electron gun assembly 501, an illumination lens 502, the first aperture plate 503, a projection lens 504, the deflector 505, the second aperture plate 506, an objective lens 507, the deflector 508, and an insulating column 514. The fourth column 222 includes the electron gun assembly 401, an illumination lens 402, the first aperture plate 403, a projection lens 404, the deflector 405, the second aperture plate 406, an objective lens 407, a deflector 408, and an insulating column 414. In the above embodiments, the lens systems such as the illumination lense, the projection lense, and the objective lense are shared by the columns. However, a plurality of columns may be preferably mounted in such a manner that each of the columns has independent lens systems, as shown in FIG. 19. In this manner, a sub-system which controls an independent optical path of electron beam is arranged in each of the insulating columns to insulate the corresponding column from other insulating columns, so that the corresponding column can exclude an influence of an electric field or a magnetic field from the other column.

Embodiment 3.

In Embodiment 3, with respect to a column, which is not broken but which does not form a pattern because it is placed in a region in which a pattern is formed in advance in Embodiments 1 and 2, an operation to prevent a beam from being irradiated from the column on a target object will be described below. Also with respect to a broken column in Embodiment 1 or 2, an operation to prevent a beam from being irradiated from the column on a target object will be described below. The contents which are not particularly explained are the same as those in Embodiment 1 or 2.

Figure 20:
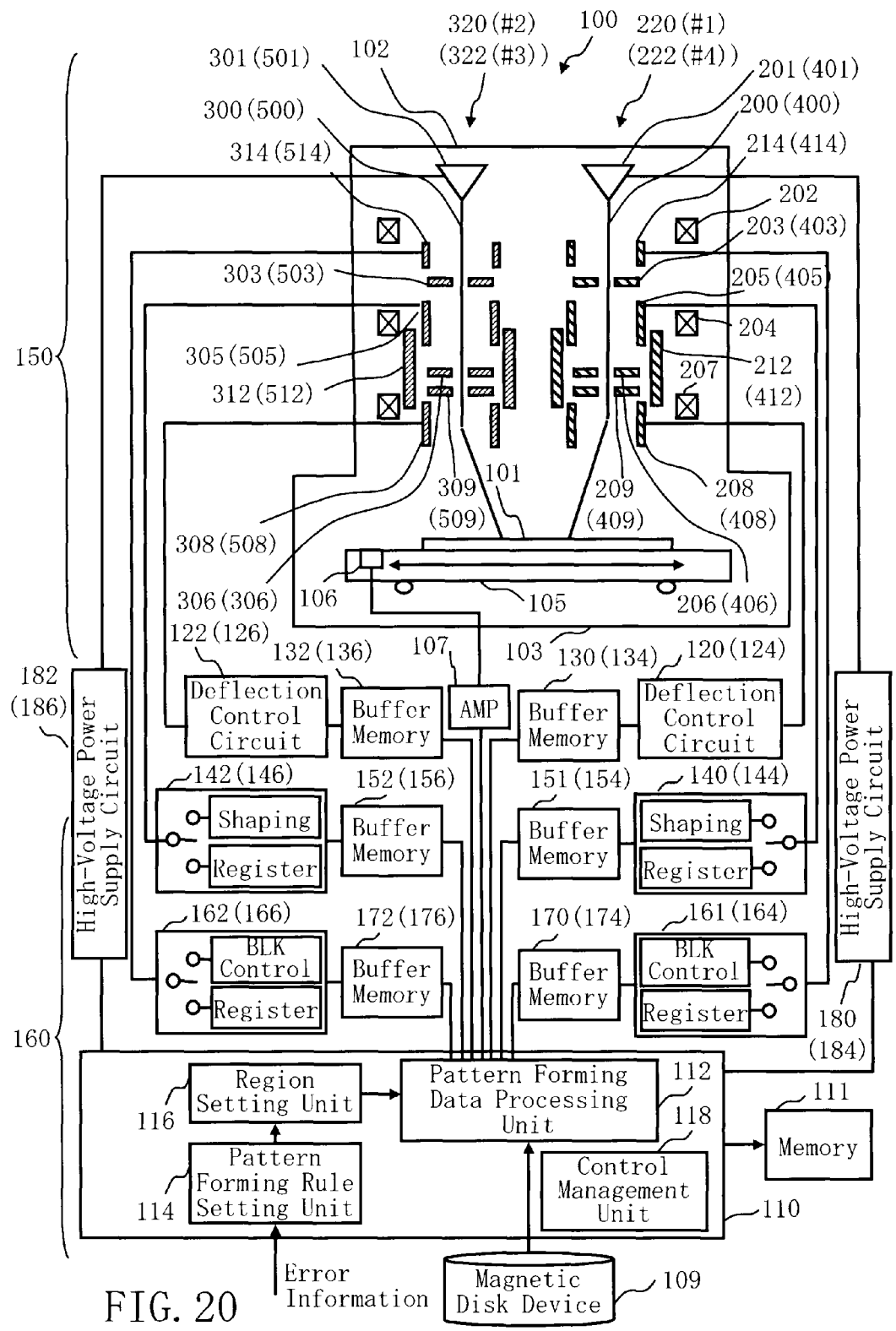
FIG. 20 is a conceptual diagram for explaining an operation of a variable-shaped electron beam pattern forming apparatus.

FIG. 20 is a conceptual diagram showing a configuration of a pattern forming apparatus according to Embodiment 3. In FIG. 20, in the first column 220 (#1) in FIG. 1, a blanking (BLK) deflector 214 and a blanking (BLK) aperture plate 209 are specified. In the second column 320 (#2), a BLK deflector 314 and a BLK aperture plate 309 are specified. In the third column 322 (#3), a BLK deflector 514 and a BLK aperture plate 509. In the fourth column 222 (#4), a BLK deflector 414 and a BLK aperture plate 409 are specified. Furthermore, in the control unit 160 in FIG. 1, deflection control circuits 140, 142, 144, 146, 161, 162, 164, and 166, buffer memories 151, 152, 154, 156, 170, 172, 174, and 176, high-voltage power supply circuits 180, 182, 184, and 186, and an amplifier 107 are specified. In addition, in the control computer 110 in FIG. 1, a control management unit 118 is specified. On the X-Y stage 105, a Faraday cup 106 is arranged at a position which does not overlap the target object 101. Other points are the same as those in FIG. 1.

An operation of the control management unit 118 may be configured as a processing function executed by software as other components in the control computer 110. The operation may also be configured by hardware obtained by an electric circuit. The operation may also be executed by a combination of the hardware obtained by the electric circuit and the software. The operation may be executed by a configuration obtained by such hardware and firmware.

The BLK deflector 214 is arranged between the electron gun assembly 201 and the first aperture plate 203. The BLK aperture plate 209 is arranged between the second aperture plate 206 and the deflector 208. The BLK deflector 314 is arranged between the electron gun assembly 301 and the first aperture plate 303. The BLK aperture plate 309 is arranged between the second aperture plate 306 and the deflector 308. The BLK deflector 414 is arranged between the electron gun assembly 401 and the first aperture plate 403. The BLK aperture plate 409 is arranged between the second aperture plate 406 and the deflector 408. The insulating column 514 is arranged between the electron gun assemblies 501 and the first aperture plates 503. The BLK aperture plate 509 is arranged between the second aperture plate 506 and the deflector 508.

The first column 220 (#1) includes the BLK deflector 214, the electron gun assembly 201, the first aperture plate 203, the deflector 205, the second aperture plate 206, the BLK aperture plate 209, the blocking cylinder 212, and the deflector 208. The second column 320 (#2) includes the electron gun assembly 301, the BLK deflector 314, the first aperture plate 303, the deflector 305, the second aperture plate 306, the BLK aperture plate 309, the blocking cylinder 312, and the deflector 308. The third column 322 (#3) includes the electron gun assembly 501, the BLK deflector 514, the first aperture plate 503, the deflector 505, the second aperture plate 506, the BLK aperture plate 509, the blocking cylinder 512, and the deflector 508. The column 222 (#4) includes the electron gun assembly 401, the BLK deflector 414, the first aperture plate 403, the BLK aperture plate 409, the deflector 405, the second aperture plate 406, the blocking cylinder 412, and the deflector 408.

A control signal input to the deflection control circuit 140 is output from the control computer 110 through the buffer 151. The deflection control circuit 140 which receives the control signal controls the deflector 205 according to the control signal. Depending on an amount of deflection obtained by the deflector 205, an irradiation position onto the second aperture plate 206 of the electron beam 200 having passed through the first aperture plate 203 is controlled. In this manner, the electron beam 200 is shaped. Alternatively, the entire electron beam 200 having passed through the first aperture plate 203 is blocked by the second aperture plate 206. Corresponding components in the second to fourth columns 320, 322, and 222 operate in the same manner as described above.

A control signal input to the deflection control circuit 161 is output from the control computer 110 through the buffer 170. The deflection control circuit 161 which receives the control signal controls the BLK deflector 214 according to the control signal. A beam is ON/OFF-controlled by the BLK deflector 214. An ON voltage is applied to the BLK deflector 214, and the electron beam 200 obtained until an OFF voltage is applied to the BLK deflector 214 after an ON voltage is applied to the BLK deflector 214 forms one shot. The electron beam 200 obtained while the OFF voltage is applied to the BLK deflector 214 passes through the second aperture plate 206, then an entire beam having passed through the second aperture plate 206 is blocked by the BLK aperture plate 209. Corresponding components in the second to fourth columns 320, 322, and 222 operate in the same manner as described above.

A high-voltage power is applied to the electron gun assembly 201 from the high-voltage power supply circuit 180 controlled by the control computer 110. Accordingly, the electron gun assembly 201 emits the electron beam 200. Corresponding components in the second to fourth columns 320, 322, and 222 operate in the same manner as described above.

For example, as shown in FIG. 7, in a case that the column 222 to be located at a position which is not an end is broken when a plurality of columns form patterns on a target object in parallel in a predetermined direction, the unbroken column 322 is not used in second scanning. This is because the column 322 is located in the region in which a pattern is formed in advance in the first pattern forming operation. The following operation is performed in the column 322 such that an electron beam is not irradiated from the column 322 onto the target object 101.

Figure 21:
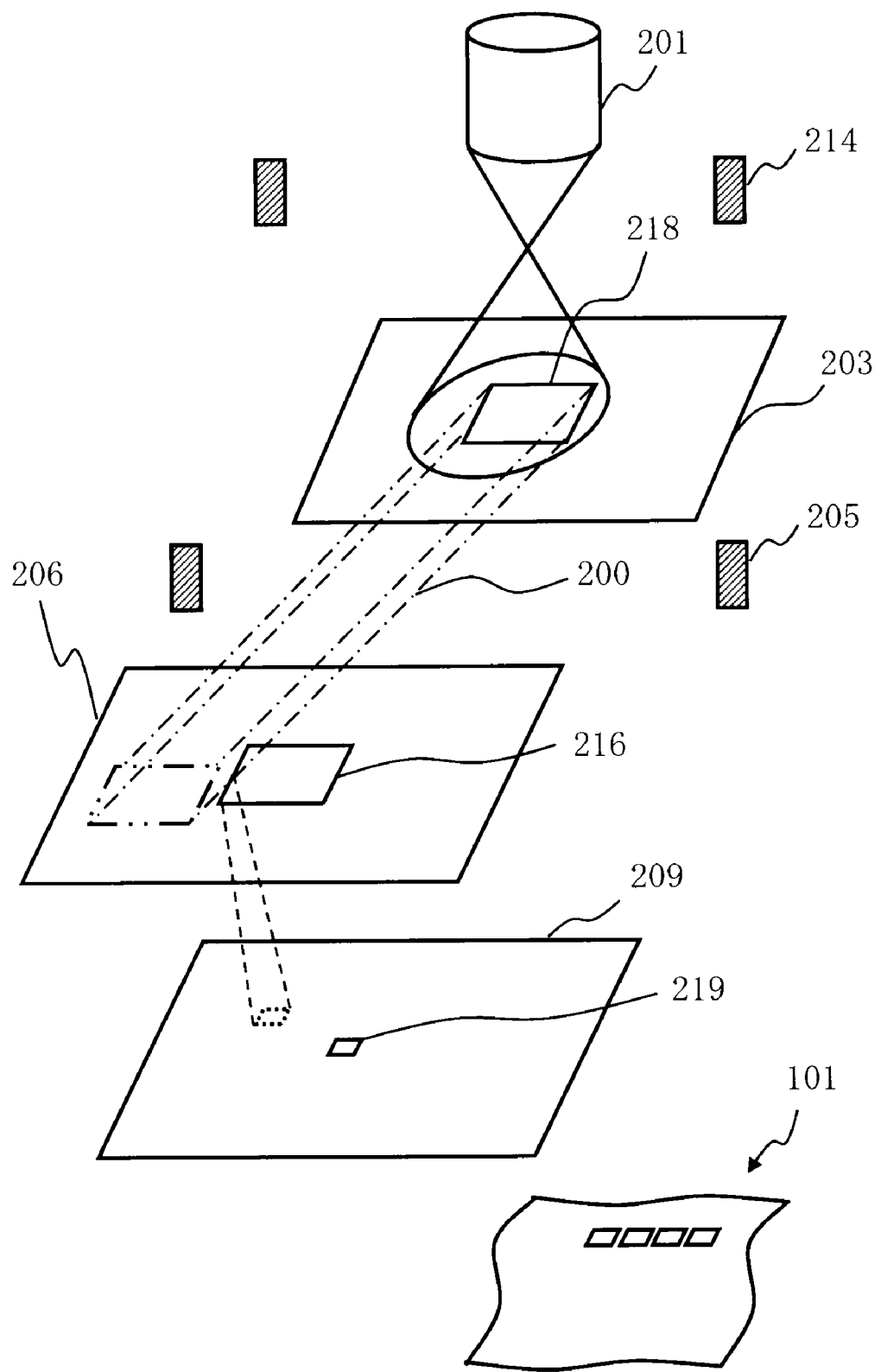
FIG. 21 is a conceptual diagram for explaining a method of blocking a beam from an unbroken column in Embodiment 3.

FIG. 21 is a conceptual diagram for explaining a method of blocking a beam from an unbroken column in Embodiment 3. FIG. 21 shows, as an example, a case in which the first column 220 is an unbroken column and is not used. When a high-voltage power is applied from the high-voltage power supply circuit 180, the electron beam 200 is emitted from the electron gun assembly 201. For this reason, the unbroken column 220 located in the region in which a pattern is formed in advance blocks an entire electron beam having passed through the first aperture plate 203 by using the second aperture plate 206. In this manner, the beam is prevented from being irradiated onto a downstream side of the column 220. In order to more strictly prevent beam leakage, an amount of deflection of the BLK deflector 214 is adjusted such that the entire electron beam is blocked by the BLK aperture plate 209. The amount of deflection of the BLK deflector 214 is controlled by the deflection control circuit 161. When such double countermeasure is made, if a beam is leaked from the second aperture plate 206, the beam can be completely blocked by the BLK aperture plate 209. In this manner, a beam passing through the opening 219 of the BLK aperture plate 209 is eliminated to prevent the beam being irradiated onto the target object 101.

An example of the control method will be described below.

Figure 22:
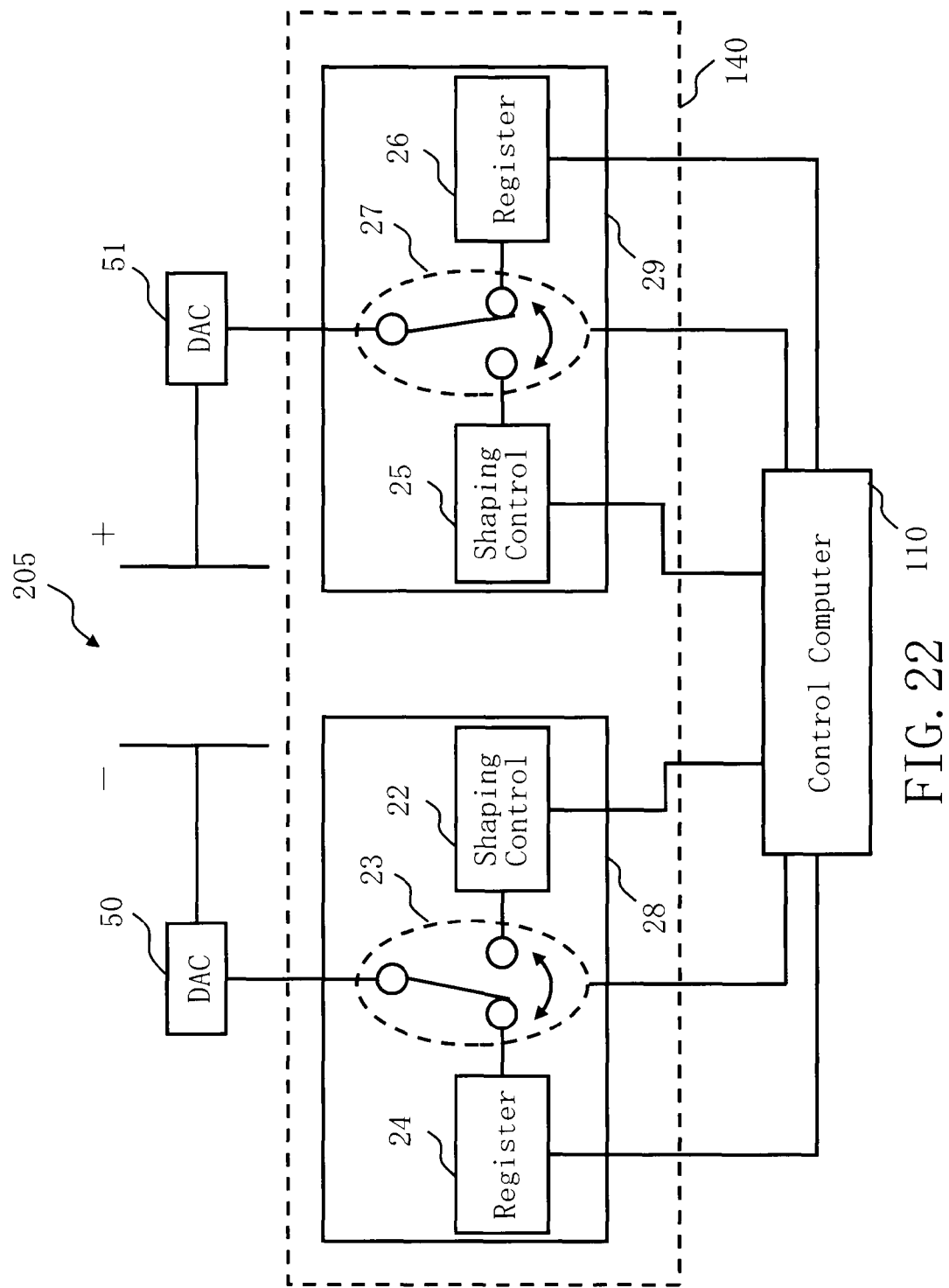
FIG. 22 is a conceptual diagram for explaining a method of controlling beam shaping and beam blocking in Embodiment 3.

FIG. 22 is a conceptual diagram for explaining a method of controlling beam shaping and beam blocking in Embodiment 3. The deflector 205 which performs shaping deflection has a plurality of sets of two electrodes as pairs. For example, the deflector 205 has four electrodes as two sets or eight electrodes as four sets. Voltages having equal potentials and opposite signs are respectively applied to two electrodes in pair of each set. In the deflection control circuit 140, deflection control units 28 and 29 which respectively apply deflection voltages for the electrodes are arranged. In FIG. 22, only one set is shown. However, depending on the number of the electrodes, deflection control units for the remaining sets are similarly arranged. In the deflection control unit 28, a shaping control unit 22 which controls beam shaping, a register 24 in which a deflection signal to block a beam is stored, and a changeover switch 23 are arranged. The shaping control unit 22, the register 24, and the changeover switch 23 are respectively controlled by the control management unit 118 in the control computer 110. In the deflection control unit 29, a shaping control unit 25 which controls beam shaping, a register 26 in which a deflection signal to block a beam is stored, and a changeover switch 27 are arranged. The shaping control unit 25, the register 26, and the changeover switch 27 are respectively controlled by the control management unit 118 in the control computer 110.

When a normal pattern forming operation is performed, the changeover switch 23 is connected to an output of the shaping control unit 22 to output a digital deflection signal for shaping to a digital/analog converter (DAC) 50, DAC 50 converts the signal into an analog signal and amplifies the signal. For example, an amplified negative deflection voltage is applied to one electrode of one set of electrodes of the deflector 205. The changeover switch 27 is connected to an output of the shaping control unit 25 to output a digital deflection signal for shaping to a digital/analog converter (DAC) 51, and the DAC 51 converts the signal into an analog signal and amplifies the signal. For example, an amplified positive deflection voltage is applied to the other electrode of one set of electrodes of the deflector 205. In this manner, the electron beam 200 having passed through the first aperture plate 203 is shaped by the second aperture plate 206 to have a desired size and a desired shape.

On the other hand, when the unbroken column 220 is unused, the changeover switch 23 is connected to an output of the register 24 to output a digital deflection signal which only blocks an entire beam to the digital/analog converter (DAC) 50, and the DAC 50 converts the signal into an analog signal and amplifies the signal. For example, an amplified negative deflection voltage is applied to one electrode of one set of electrodes of the deflector 205. The changeover switch 27 is connected to an output of the register 26 to output a digital deflection signal which only blocks an entire beam to the digital/analog converter (DAC) 51, and the DAC 51 converts the signal into an analog signal and amplifies the signal. For example, an amplified positive deflection voltage is applied to the other electrode of one set of electrodes of the deflector 205. In this manner, the entire electron beam 200 having passed through the first aperture plate 203 is blocked by the second aperture plate 206.

Also in the deflection control circuit 161, the same components as those of the deflection control circuit 140 are arranged. When a normal pattern forming operation is performed, one changeover switch is connected to an output of one BLK control unit to outputs a digital deflection signal for turning ON/OFF a beam to one DAC, and the DAC converts the signal into an analog signal and amplifies the signal. For example, an amplified negative deflection voltage is applied to one electrode of one set of electrodes of the BLK deflector 214. The other changeover switch is connected to an output of the other BLK control unit to output a digital deflection signal for turning ON/OFF a beam to the other DAC, and the DAC converts the signal into an analog signal and to amplifies the signal. For example, an amplified positive deflection voltage is applied to the other electrode of one set of electrodes of the BLK deflector 214. In this manner, an ON/OFF operation of the beam is performed. In this case, when the beam is an ON state, a voltage need not be applied to the BLK deflector 214.

On the other hand, when the unbroken column 220 is unused, the changeover switch 23 is connected to an output of one register to output a digital deflection signal for turning OFF a beam to one DAC, and the DAC converts the signal into an analog signal and amplifies the signal. For example, an amplified negative deflection voltage is applied to one electrode of one set of electrodes of the BLK deflector 214. The other changeover switch is connected to an output of the other register to output a digital deflection signal for turning OFF a beam to the other DAC, and the DAC converts the signal into an analog signal and amplifies the signal. For example, an amplified positive deflection voltage is applied to the other electrode of one set of electrodes of the deflector 214. In this manner, the entire electron beam 200 having passed through the second aperture plate 206 is blocked by the BLK aperture plate 209.

When any one of the second to fourth columns 320 and 322, and 222 is an unbroken column and the unbroken column is unused, components in the unbroken column similarly operate.

Also for example, when the unbroken column 32 is unused in the second scanning in a case that the column 35 is broken as described in FIG. 12, the same operation as described above is performed.

As described above, in a case that a column is broken when a plurality of columns form patterns on a target object in parallel in a predetermined direction, as the n-th pattern forming operation, unbroken columns form a pattern on the target object in parallel in a predetermined direction. As the (n+1)-th pattern forming operation, an unbroken column forms a pattern in a region located at a position of a broken column, and an unbroken column located in a region in which a pattern is formed in advance in the n-th pattern forming operation blocks an entire electron having passed through the first shaping aperture plate by the second shaping aperture plate. Furthermore, the column adjusts an amount of deflection of the BLK deflector such that the entire electron beam is blocked by the BLK aperture plate.

An operation of broken column will be described below. For example, when the first column 220 is broken, and the column 220 is to be stopped, the following operation is performed. For example, an abnormal column is detected, and an unused column 220 is set by a user. When the unused column 220 is set, the control management unit 118 controls the high-voltage power supply circuit 180 not to apply a voltage from the high-voltage power supply circuit 180 to the electron gun assembly 201 serving as a beam source in the 220. In this manner, emission of the electron beam from the broken column 220 can be stopped.

For example, when the first column 220 is broken, but the column 220 is not to be stopped, the following operation is performed. For example, an abnormal column is detected, and an unused column 220 is set by a user. When the unused column 220 is set, the control management unit 118 moves the X-Y stage 105 to a position where a beam can be deflected to the Faraday cup 106. The control management unit 118 confirms that the BLK deflector 214 and the shaping aperture plate 206 normally function. For example, a beam is irradiated onto the Faraday cup 106, and a beam current is measured through the amplifier 107 to make it possible to determine whether beam deflection is normal. As in the case in which an unbroken column is unused as described above, the broken column 220 blocks the entire electron beam having passed through the first shaping aperture plate 203 by the second shaping aperture plate 206 to block. Furthermore, the column 220 adjusts an amount of deflection of the BLK deflector 214 such that the entire electron beam is blocked by the BLK aperture plate 209. In this manner, emission of the electron beam from the broken column 220 can be prevented. The control method may be that used when an unbroken column is unused as described above.

The embodiments are described above with reference to the concrete examples. However, the present invention is not limited to the concrete examples. In Embodiment 2, the meshed regions are made to be the chip regions. However, processing regions obtained by further dividing stripes in the x direction may be used.

Parts of the apparatus configuration, the control method, and the like which are not needed to be explained directly for the explanation of the present invention are not described. However, a necessary apparatus configuration and a necessary control method can be appropriately selected and used. For example, a control unit configuration which controls the pattern forming apparatus 100 is not described. However, a necessary control unit configuration is appropriately selected and used, as a matter of course.

Furthermore, the multi-column system is exemplified in the above description. However, the present invention can also be applied to another multi-beam system. For example, a multi-beam system using a blanking aperture plate array will be described below. A pattern forming system for the blanking aperture plate array can be considered, in a sense, that each of the columns in FIG. 4 are replaced by a gaussian beam, each of the beams can be ON/OFF-controlled, and the beams are made to scan. An example of a pattern forming operation is shown in the next drawing.

Figure 23:
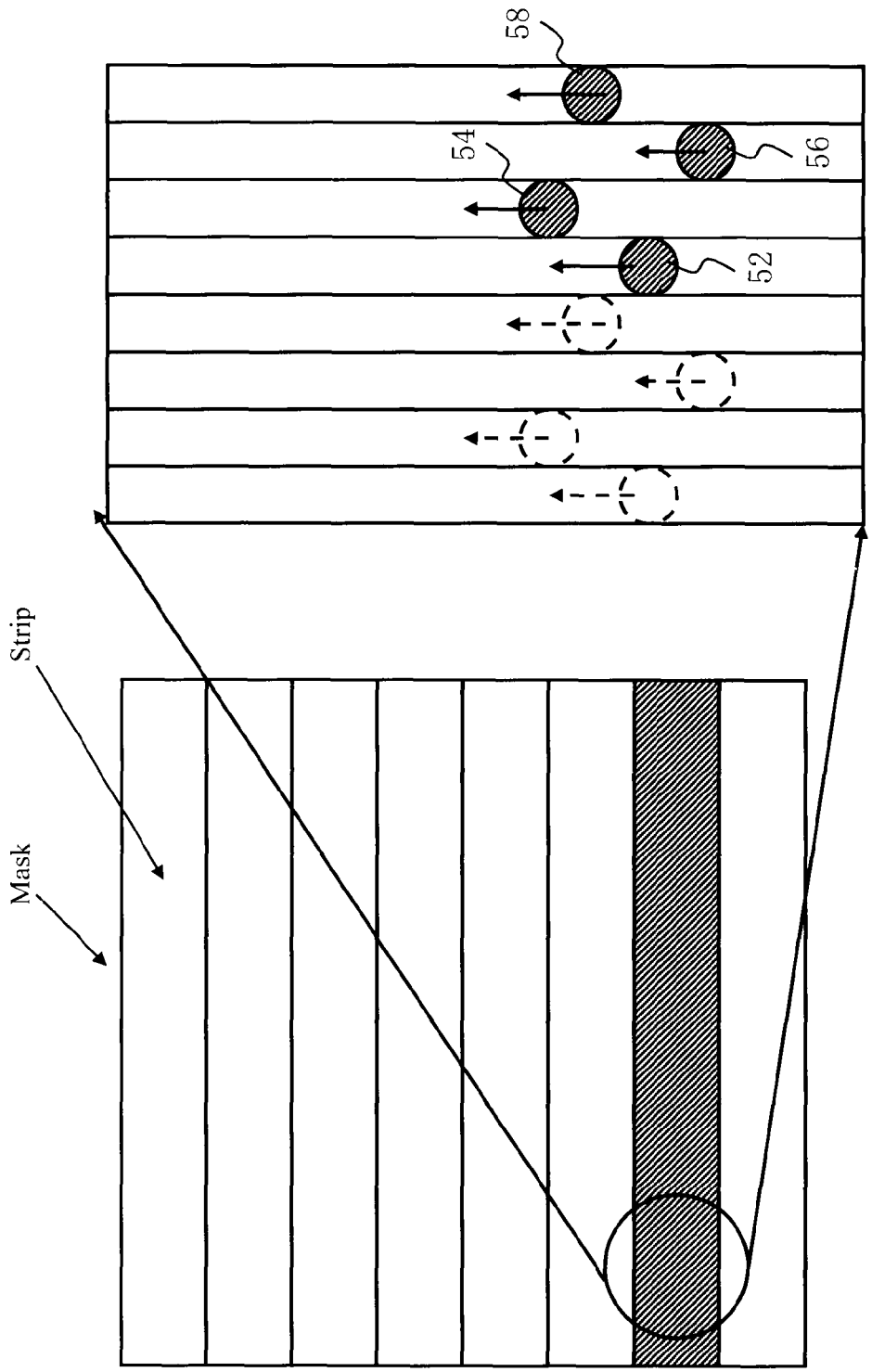
FIG. 23 is a diagram showing an example of a pattern forming system of a blanking aperture plate array.
Figure 24:
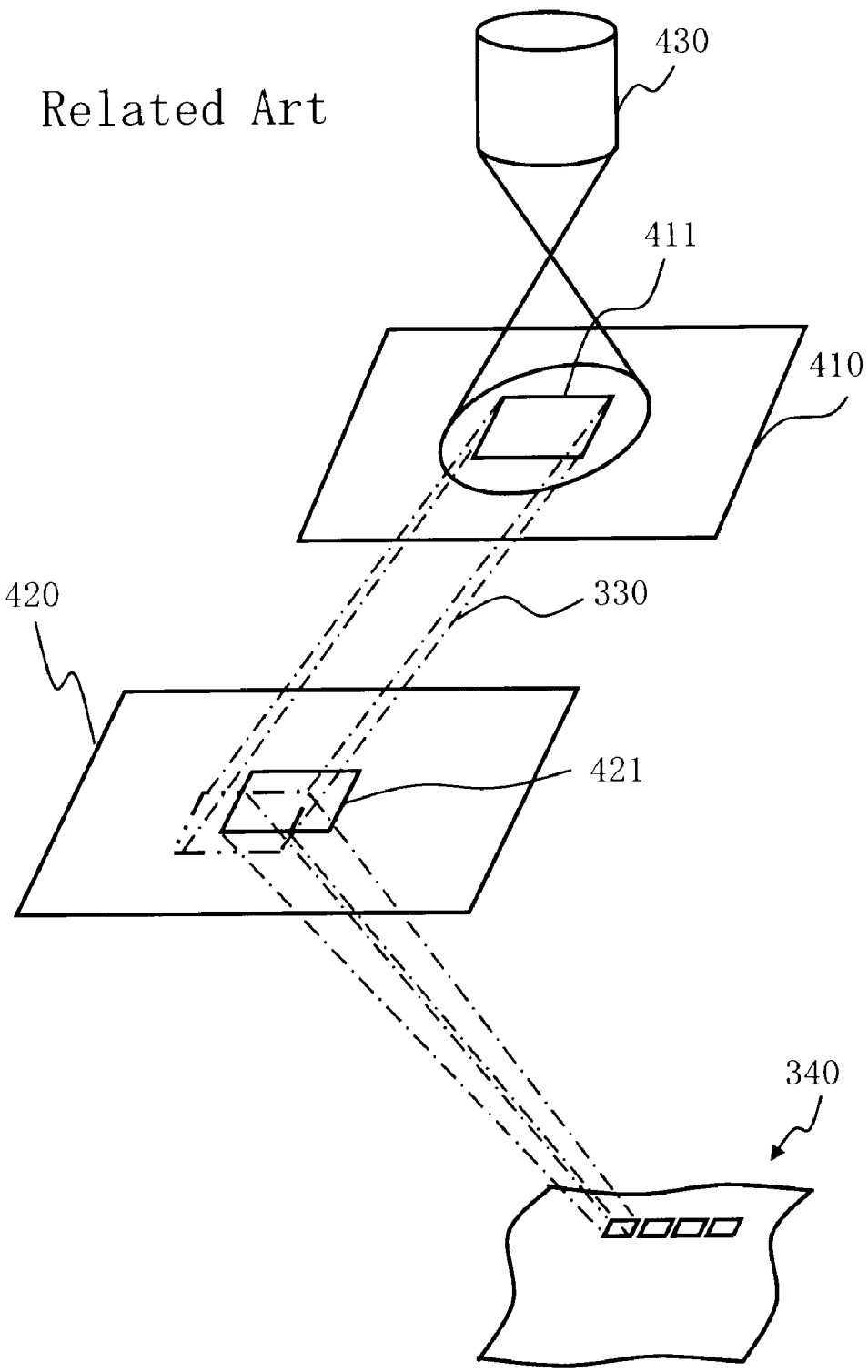
FIG. 24 is a conceptual diagram for explaining an operation of a variable-shaped electron beam lithography apparatus

FIG. 23 is a diagram showing an example of a pattern forming system for a blanking aperture plate array. A pattern forming region is divided into strip-shaped stripe regions. Each of the stripes is scanned by four gaussian beams 52, 54, 56, and 58. In this method, the beams are ON/OFF-controlled to form a pattern. In this case, when an end beam is broken, a pattern forming operation may be performed as shown in FIG. 6. When two central beams are broken, control may be performed as shown in 11. Furthermore, in a case that a beam next to an end beam and positioned closer than the end beam is broken when six beams can be simultaneously controlled, control may be performed as shown in FIG. 12. The present invention is explained by using the multi-column system. However, the present invention can also be used in another case, for example in a multi-beam system using a blanking aperture plate array as described here.

In the above description, the discussion has been made for cases, in which a plurality of columns are used and some of the columns are broken. However, the present invention is not limited to the cases. For example, the present invention can also be applied to a case, in which an unbroken column is intentionally set unused. There is a case, in which ten columns of eleven columns are normally used, and the remaining column is kept for backup and intentionally unused, or a case, in which one column of a plurality of columns is intentionally unused for maintenance and a pattern forming operation is performed by only the other columns. In such cases, the present invention may be applied.

In addition, all pattern forming apparatuses and pattern forming methods which include the elements of the present invention and can be attained by appropriately changing in design by a person skilled in the art are included in the spirit and scope of the invention.

Additional advantages and modification will readily occur to those skilled in the art. Therefore, the invention in its broader aspects is not limited to the specific details and representative embodiments shown and described herein. Accordingly, various modifications may be made without departing from the spirit or scope of the general invention concept as defined by the appended claims and their equivalents.

What is claimed is:

1. A pattern forming apparatus using a lithography technique comprising:
   a stage configured to allow a target object to be placed thereon;
   a plurality of columns configured to form patterns on the target object by using a charged particle beam while moving relatively to the stage;
   a pattern forming rule setting unit configured to set a pattern forming rule depending on a position of a broken one of the plurality of columns;
   a region setting unit configured to set regions so that unbroken ones of the plurality of columns respectively form a pattern in one of the regions;
   a plurality of control circuits each configured to control any one of the plurality of columns different from others of the plurality of columns controlled by others of the plurality of control circuits; and
   a pattern forming data processing unit configured to perform a converting process on pattern forming data for the regions set to output a corresponding data generated by the converting process to the control circuit of a corresponding one of the unbroken ones of the plurality of columns respectively,
   wherein as the plurality of columns, first to fourth columns arranged in a (2×2) array having two horizontal lines and two vertical lines are provided,
   the pattern forming rule setting unit, in a case that the fourth column of the first to fourth columns is broken, sets a pattern forming rule such that
      the first column forms a pattern in a small pattern forming region at coordinates (i, j), the second column forms a pattern in a small pattern forming region at coordinates (i, j+1), and the third column forms a pattern in a small pattern forming region at coordinates (i+2, j+1) at almost a same time, respectively, the small pattern forming regions at coordinates (i, j), (i, j+1), and (i+2, j+1) being included in a plurality of small pattern forming regions obtained by virtually dividing a pattern forming region of the target object into meshed regions, and
      the first column forms a pattern in a small pattern forming region at coordinates (i+1, j+1), the second column forms a pattern in a small pattern forming region at coordinates (i+1, j+2), and the third column forms a pattern in a small pattern forming region at coordinates (i+3, j+2) at almost a same time, respectively.

2. The apparatus according to claim 1, wherein the first to fourth columns are arranged such that the first and second columns are arranged in this order in a y direction, the fourth and third columns are arranged in this order in the y direction, the fourth column is arranged in a x direction from the first column, and the third column is arranged in a x direction from the second column.

3. A pattern forming method using a lithography technique comprising:
   setting a pattern forming rule depending on a position of a broken column in a pattern forming apparatus including a plurality of columns;
   setting regions so that unbroken ones of the plurality of columns respectively form a pattern in one of the regions;
   performing a converting process on pattern forming data for the regions set to output a corresponding data generated by the converting process to a control circuit of a corresponding one of the unbroken ones of the plurality of columns; and forming patterns on a target object by using charged particle beams obtained and by using the unbroken ones of the plurality of columns while the plurality of columns is moved relatively to a stage on which the target object is placed, wherein as the plurality of columns, first to fourth columns arranged in a (2×2) array having two horizontal lines and two vertical lines are provided, in a case that the fourth column of the first to fourth columns is broken, the first column forms a pattern in a small pattern forming region at coordinates (i, j), the second column forms a pattern in a small pattern forming region at coordinates (i, j+1), and the third column forms a pattern in a small pattern forming region at coordinates (i+2, j+1) at almost a same time, respectively, the small pattern forming regions at coordinates (i, j), (i, j+1), and (i+2, j+1) being included in a plurality of small pattern forming regions obtained by virtually dividing a pattern forming region of the target object into meshed regions, and the first column forms a pattern in a small pattern forming region at coordinates (i+1, j+1), the second column forms a pattern in a small pattern forming region at coordinates (i+1, j+2), and the third column forms a pattern in a small pattern forming region at coordinates (i+3, j+2) at almost a same time, respectively.

* * * * *